US012787699B2

(12) United States Patent
Lee et al.

(10) Patent No.: US 12,787,699 B2
(45) Date of Patent: Nov. 3, 2026

(54) ROTATIONAL INTERFACE, CARRIER TRANSFER SYSTEM INCLUDING THE SAME, AND SEMICONDUCTOR MANUFACTURING METHOD USING THE SAME

(71) Applicant: SAMSUNG ELECTRONICS CO., LTD., Suwon-si (KR)

(72) Inventors: Hochan Lee, Suwon-si (KR); Youngon Oh, Suwon-si (KR); Sanghyuk Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 18/501,970

(22) Filed: Nov. 3, 2023

(65) Prior Publication Data

US 2024/0332053 A1 Oct. 3, 2024

(30) Foreign Application Priority Data

Mar. 31, 2023 (KR) ........................ 10-2023-0042973

(51) Int. Cl.
*H10P 72/30* (2026.01)

(52) U.S. Cl.
CPC ...... *H10P 72/3202* (2026.01); *H10P 72/3221* (2026.01); *H10P 72/3404* (2026.01)

(58) Field of Classification Search
CPC ......... H01L 21/67736; H01L 21/67733; H01L 21/6773; H01L 21/67769; H01L 21/67706; H01L 21/67757; H01L 21/67775; H10P 72/3202; H10P 72/3218; H10P 72/3221; H10P 72/3222; H10P 72/3221; H10P 72/3222; H10P 72/3404
USPC ................. 414/331.02, 331.03, 331.05, 564; 248/415, 425, 521, 522
See application file for complete search history.

(56) References Cited

U.S. PATENT DOCUMENTS

| | | | | |
|---|---|---|---|---|
| 4,867,629 A * | 9/1989 | Iwasawa | H01L 21/67769 211/41.18 |
| 8,882,433 B2 * | 11/2014 | Bonora | H01L 21/67775 414/940 |
| 10,564,632 B2 | 2/2020 | Hsu et al. | |
| 2003/0059284 A1 * | 3/2003 | Inui | B65G 1/0485 414/331.02 |

(Continued)

FOREIGN PATENT DOCUMENTS

| | | | |
|---|---|---|---|
| CN | 105730960 A * | 7/2016 | G07B 17/00193 |
| KR | 10-2011-0082362 | 7/2011 | |

(Continued)

OTHER PUBLICATIONS

Office Action dated Jul. 21, 2026 issued in corresponding to Korean Patent Application No. 10-2023-0042973.

*Primary Examiner* — Glenn F Myers
(74) *Attorney, Agent, or Firm* — Morgan, Lewis & Bockius LLP

(57) ABSTRACT

A rotational interface includes a base column extending in a first direction, a rotary unit, and a carrier plate extending from the base column in a second direction and connected to the rotary unit, the carrier plate includes a plate body extending in the second direction and coupled to the base column, and a storage pot disposed on the plate body and having an upper surface, and the storage pot includes a fixing pin located on the upper surface of the storage pot and that fixes a semiconductor carrier to the plate body.

18 Claims, 25 Drawing Sheets

(56) References Cited

U.S. PATENT DOCUMENTS

| | | | | |
|---|---|---|---|---|
| 2003/0198541 | A1* | 10/2003 | Davis | H10P 72/0456 414/217 |
| 2008/0260502 | A1* | 10/2008 | Aburatani | H01L 21/67775 414/816 |
| 2010/0074717 | A1 | 3/2010 | Huang et al. | |
| 2015/0380288 | A1* | 12/2015 | Hirano | C23C 16/54 438/597 |
| 2017/0313458 | A1* | 11/2017 | Harth | B29C 66/43121 |
| 2020/0211881 | A1 | 7/2020 | Kuwahara | |
| 2020/0312631 | A1* | 10/2020 | Marubayashi | H01L 21/67303 |
| 2022/0348415 | A1 | 11/2022 | Li et al. | |
| 2023/0116192 | A1* | 4/2023 | Austrheim | B65G 1/0464 414/331.05 |
| 2023/0133865 | A1* | 5/2023 | Oh | B66C 19/00 414/222.13 |
| 2024/0128108 | A1* | 4/2024 | Ito | H01L 21/67389 |
| 2024/0258146 | A1* | 8/2024 | Hsu | H10P 72/3218 |

FOREIGN PATENT DOCUMENTS

| | | | |
|---|---|---|---|
| KR | 10-2020-0129296 | | 11/2020 |
| KR | 10-2320637 | | 11/2021 |
| KR | 10-2022-0047367 | A | 4/2022 |
| KR | 10-2022-0160063 | A | 12/2022 |

* cited by examiner

ROTATIONAL INTERFACE, CARRIER TRANSFER SYSTEM INCLUDING THE SAME, AND SEMICONDUCTOR MANUFACTURING METHOD USING THE SAME

CROSS-REFERENCE TO RELATED APPLICATION

This application claims priority under 35 U.S.C. § 119 to Korean Patent Application No. 10-2023-0042973, filed on Mar. 31, 2023, in the Korean Intellectual Property Office, the disclosure of which is incorporated by reference herein in its entirety.

TECHNICAL FIELD

Embodiments of the present disclosure described herein relate to a rotational interface, a carrier transfer system including the same, and a semiconductor manufacturing method using the same, and more particularly, relate to a rotational interface of a semiconductor carrier transfer system, and a carrier transfer system including the same.

DISCUSSION OF RELATED ART

A process of manufacturing a semiconductor may include various sub-processes. To facilitate efficient handling of the semiconductor during the manufacturing process, a semiconductor substrate may be transported and/or stored while being contained in a dedicated semiconductor carrier. The semiconductor carrier may be used to secure a number of semiconductor substrates during the manufacturing process, including for transport between sub-process lines, buildings, and the like. In some cases, the semiconductor carrier, bearing the semiconductor substrates, may need to be placed in a semiconductor carrier preserving facility, also called a stocker, which may be a storage solution for temporarily storing the semiconductor carrier and the semiconductor substrates between the sub-processes.

SUMMARY

An aspect of the present disclosure provides a rotational interface by which a weight of a semiconductor carrier interface may be reduced, a carrier transfer system including the same, and a semiconductor manufacturing method using the same.

Another aspect of the present disclosure provides a rotational interface by which a semiconductor carrier interface may be easily installed, a carrier transfer system including the same, and a semiconductor manufacturing method using the same.

Another aspect of the present disclosure provides a rotational interface by which a transfer speed and a capacity of a semiconductor carrier may be increased, a carrier transfer system including the same, and a semiconductor manufacturing method using the same.

Another aspect of the present disclosure provides a rotational interface by which installation costs of a semiconductor carrier interface may be reduced, a carrier transfer system including the same, and a semiconductor manufacturing method using the same, by which installation costs of a semiconductor carrier interface may be reduced.

Aspects of the present disclosure are not limited to the above-mentioned ones, and other aspects will be clearly understood by an ordinary person in the art from the following description.

According to an aspect of the present disclosure, a rotational interface includes a base column extending in a first direction, a rotary unit, and a carrier plate extending from the base column in a second direction and connected to the rotary unit, the carrier plate includes a plate body extending in the second direction and coupled to the base column, and a storage pot disposed on the plate body and having an upper surface, and the storage pot includes a fixing pin located on the upper surface of the storage pot and that fixes a semiconductor carrier to the plate body.

According to another aspect of the present disclosure, a carrier transfer system includes a travel rail, an overhead hoist transport movably coupled to the travel rail, and a rotational interface, the rotational interface includes a base column extending in a first direction, a rotary unit, and a carrier plate extending in a second direction from the base column and connected to the rotary unit, and the carrier plate includes a plate body coupled to the base column and extending in the second direction.

According to another aspect of the present disclosure, a semiconductor manufacturing method includes moving an overhead hoist transport to a rotational interface comprising a first carrier plate and a second carrier plate spaced apart in a vertical direction, rotating the second carrier plate to be unaligned with the first carrier plate, and loading, by the overhead hoist transport, a semiconductor carrier onto the first carrier plate.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
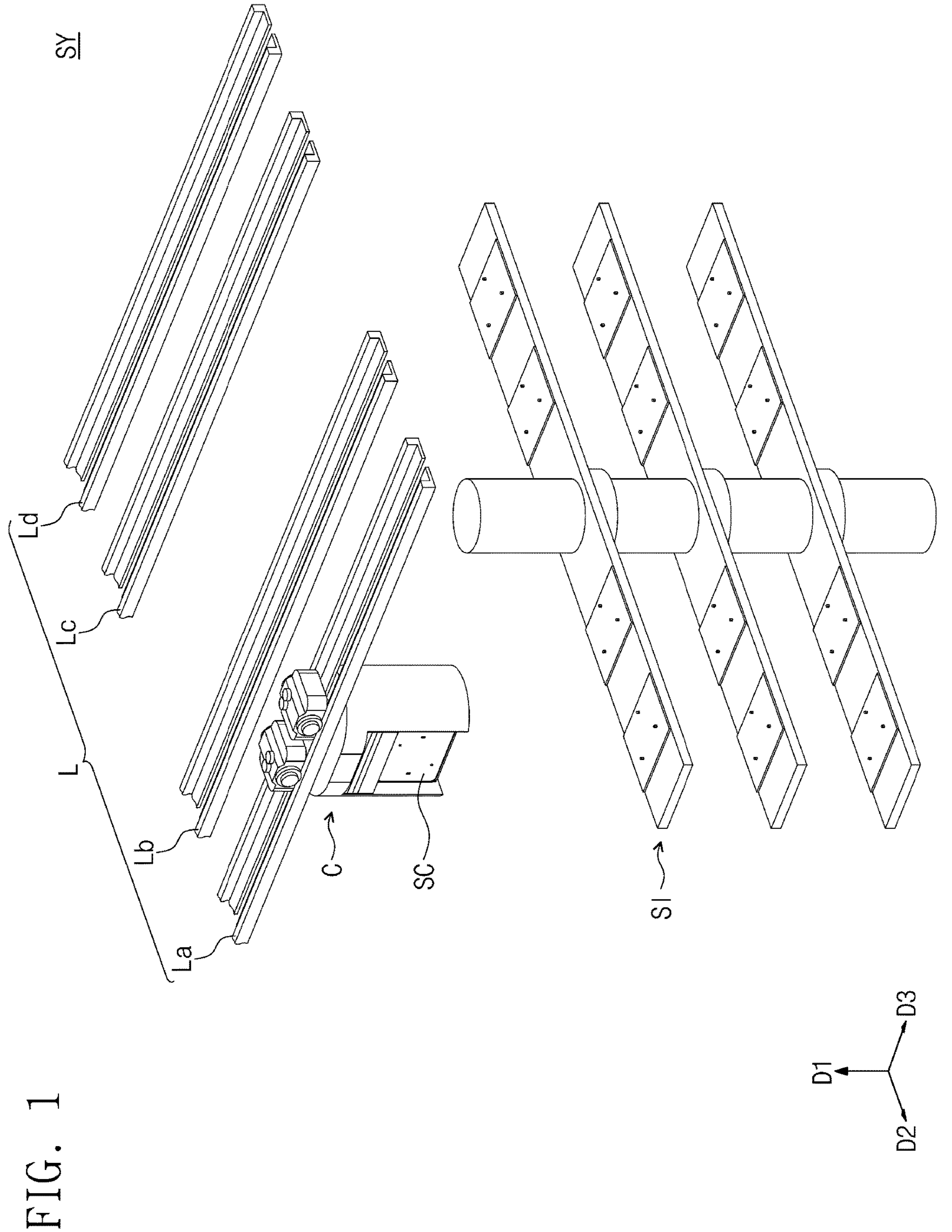
FIG. 1 is a perspective view illustrating a carrier transfer system according to embodiments of the present disclosure.

Hereinafter, embodiments of the present disclosure will be described with reference to the accompanying drawings. Throughout the specification, the same reference numerals may denote to the same components.

Hereinafter, D1 may denote a first direction, D2 may denote a second direction that crosses the first direction D1, and D3 may denote a third direction that crosses the first direction D1 and the second direction D2.

The first direction D1 may be an upward direction, and an opposite direction to the first direction D1 may be a downward direction. The first direction D1 and the opposite direction to the first direction D1 may be a vertical direction. Furthermore, each of the second direction D2 and the third direction D3 may be a horizontal direction.

Figure 2:
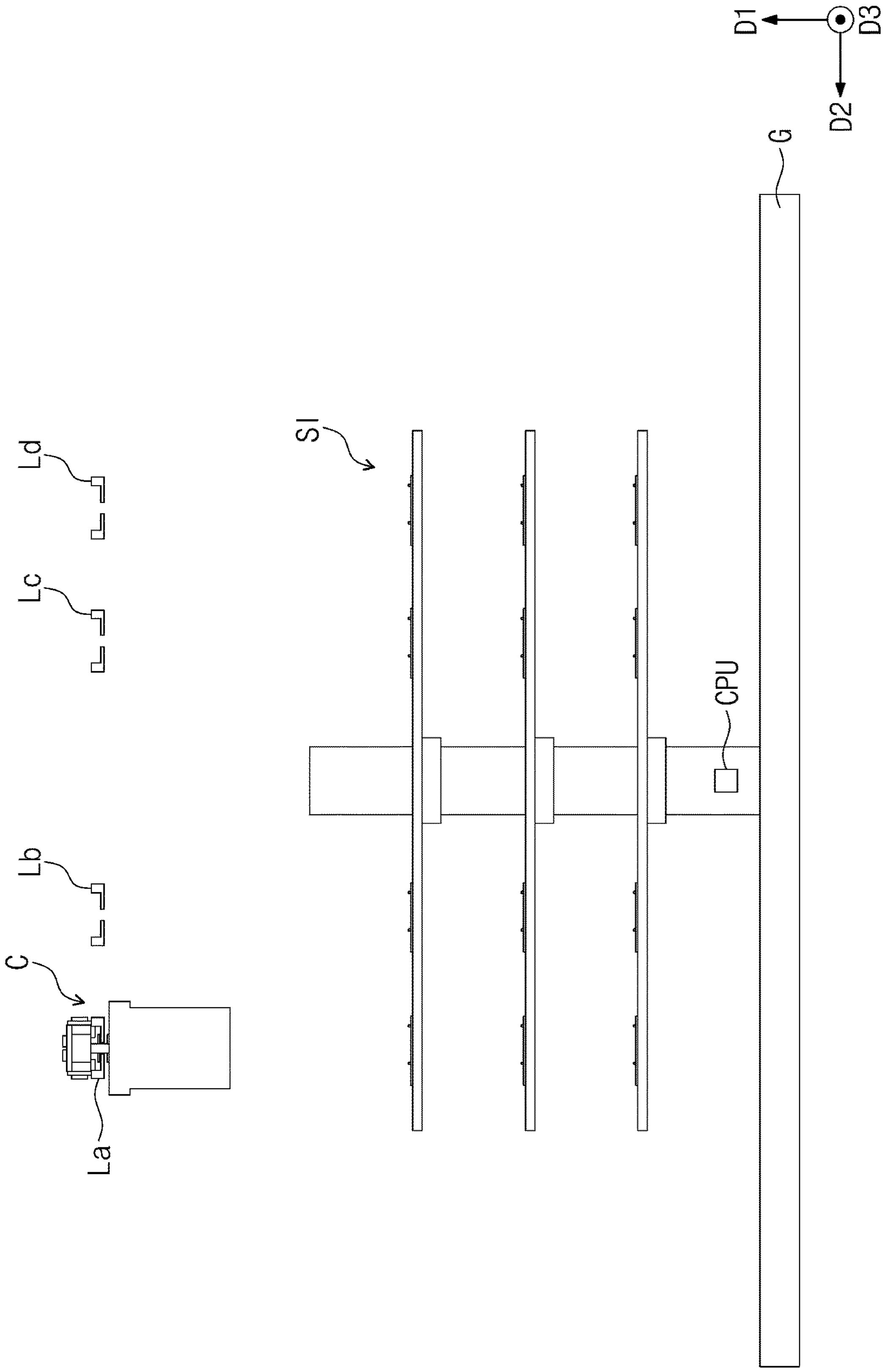
FIG. 2 is a front view illustrating a carrier transfer system according to embodiments of the present disclosure.
Figure 3:
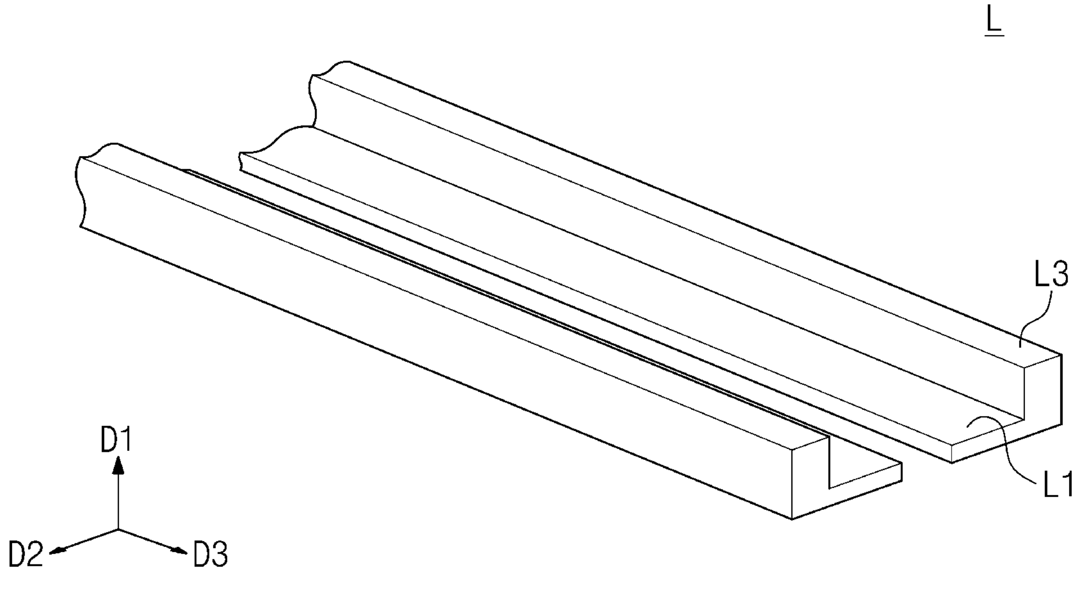
FIG. 3 is a perspective view illustrating a travel rail according to embodiments of the present disclosure.
Figure 4:
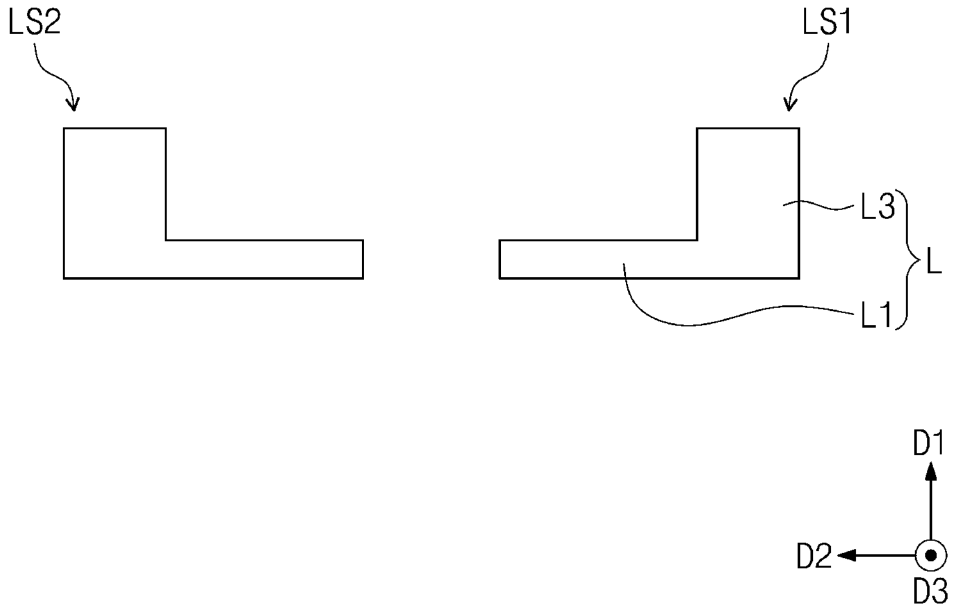
FIG. 4 is a front view illustrating a travel rail according to embodiments of the present disclosure.

FIG. 1 is a perspective view illustrating a carrier transfer system SY according to embodiments of the present disclosure. FIG. 2 is a front view illustrating the carrier transfer system SY according to embodiments of the present disclosure. FIG. 3 is a perspective view illustrating a travel rail L according to embodiments of the present disclosure. FIG. 4 is a front view illustrating the travel rail L according to embodiments of the present disclosure.

Referring to FIG. 1 and FIG. 2, the carrier transfer system SY may be provided. A semiconductor may be fed into and contained in a semiconductor carrier SC and various processes may be performed on the semiconductor during manufacturing. During the manufacture of the semiconductor, the semiconductor carrier SC may be transferred to different lines or buildings to perform various processes. In the different lines or buildings, different processes may be performed. For example, one process, such as manufacturing of a wafer, oxidation, photolithography, etching, deposition, metal wiring, a test, and packaging, may be performed in one building, and another process, such as the manufacturing of a wafer, the oxidation, the photolithography, the etching, the deposition, the metal wiring, the test, and the packaging, may be performed in another building.

The carrier transfer system SY may include a travel rail L, an overhead hoist transport (OHT) C, and a rotational interface SI. Detailed contents of the rotational interface SI are described herein. Referring to FIG. 1, FIG. 2, and FIG. 3, the travel rail L may be located on an upper side of the rotational interface SI. The travel rail L may extend in a horizontal direction while constraining movement of the OHT C in a vertical direction. However, the present disclosure is not limited thereto.

A plurality of travel rails L may be provided. For example, as illustrated in FIG. 1, a first travel rail La, a second travel rail Lb, a third travel rail Lc, and a fourth travel rail Ld may be provided. However, the present disclosure is not limited thereto, and a different number of travel rails L may be provided. For example, two, three, or five travel rails L may be provided. The plurality of travel rails L may be disposed to be spaced apart from each other in the horizontal direction. The plurality of travel rails L may not be connected to each other. That is, the first travel rail La and the second travel rail Lb may not be connected to each other. The OHT C may be movably coupled to the first travel rail La. Accordingly, the OHT C that is moved along the first travel rail La may not be directly moved to the second travel rail Lb.

In a case where the plurality of travel rails L may be connected to each other, for example, by curved U-shaped portions (not illustrated), and the OHT C may be moved along the travel rail L to different portions thereof, including the first travel rail La, the second travel rail Lb, etc.

Referring to FIG. 3 and FIG. 4, the travel rail L may include a first side LS1 and a second side LS2 having a same shape. For example, the first side LS1 and the second side LS2 may be symmetrical. However, the present disclosure is not limited thereto, and the first side LS1 and the second side LS2 may have different shapes. Each side of the travel rail L may include a lower travel rail L1 that may be coupled to the OHT C (see FIG. 5), and an upper travel rail L3, onto which a transfer wheel C1 (see FIG. 1 and FIG. 5) of the OHT C may be positioned. The lower travel rail L1 may have a shape that protrudes to be coupled to the OHT C. The lower travel rail L1 may protrude from the upper travel rail L3. The lower travel rail L1 may protrude from a lower portion of the upper travel rail L3. For example, the lower travel rail L1 may include a rectangular parallelepiped shape that protrudes in a central direction. For example, two of the lower travel rails L1 of the travel rail L may protrude toward each other in the central direction. However, the present disclosure is not limited thereto. The transfer wheel C1 of the OHT C may be located on an upper surface of the upper travel rail L3.

Figure 5:
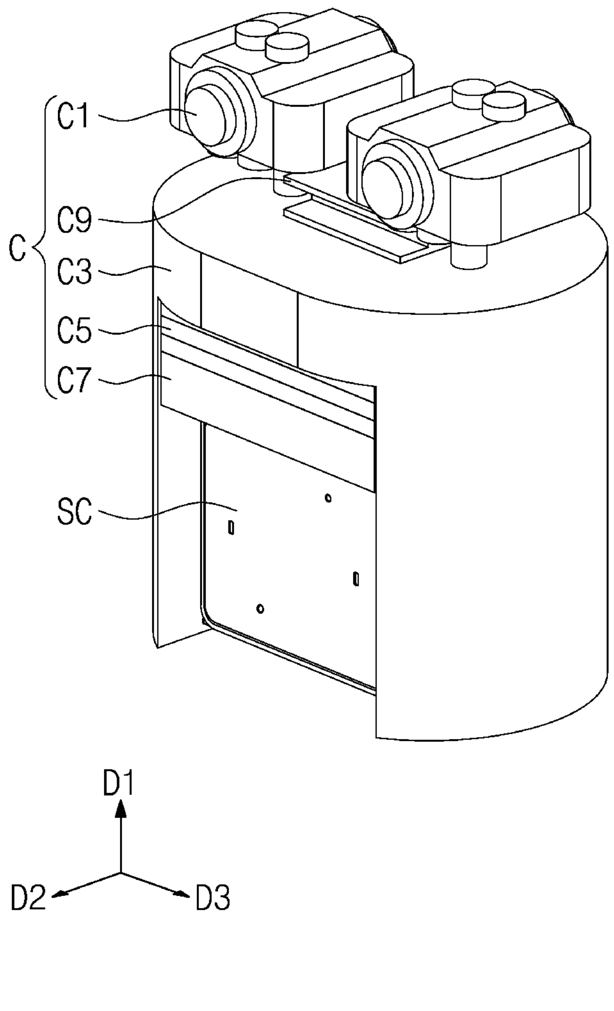
FIG. 5 is a perspective view illustrating an OHT coupled to a semiconductor carrier according to embodiments of the present disclosure.
Figure 6:
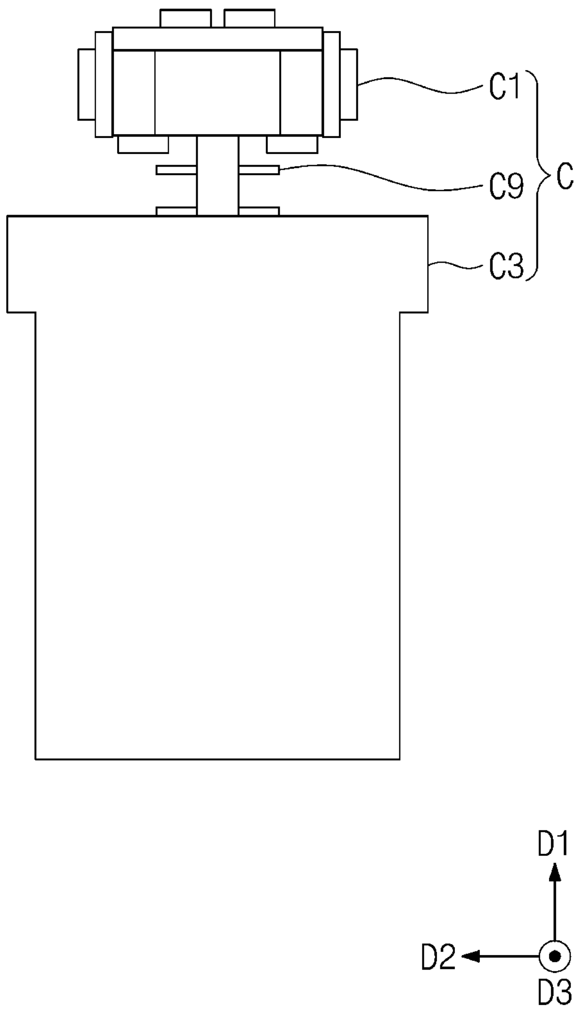
FIG. 6 is a side view illustrating an OHT coupled to a semiconductor carrier according to embodiments of the present disclosure.
Figure 7:
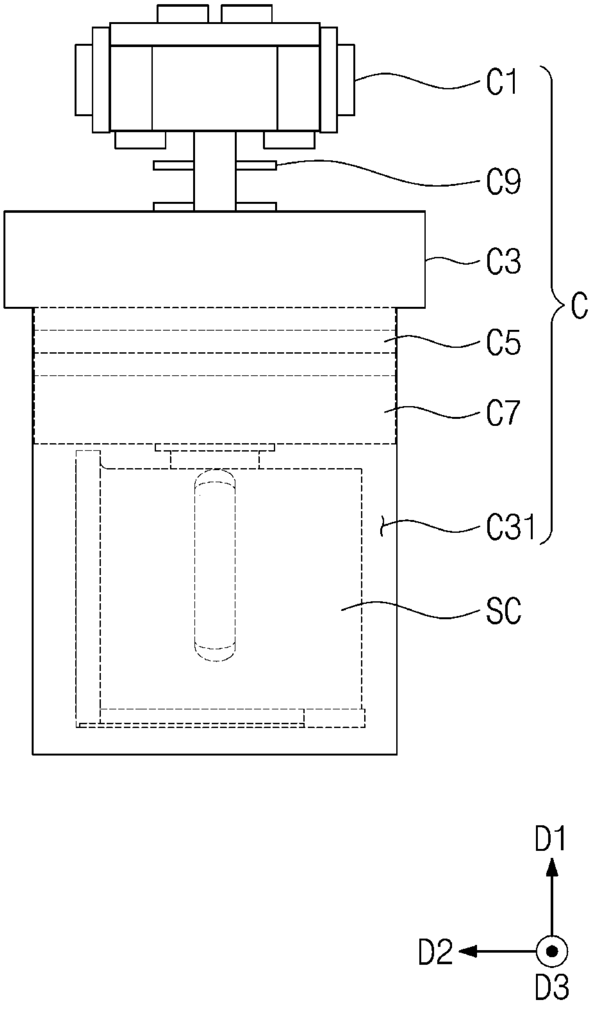
FIG. 7 is a projection view illustrating an OHT coupled to a semiconductor carrier according to embodiments of the present disclosure.
Figure 8:
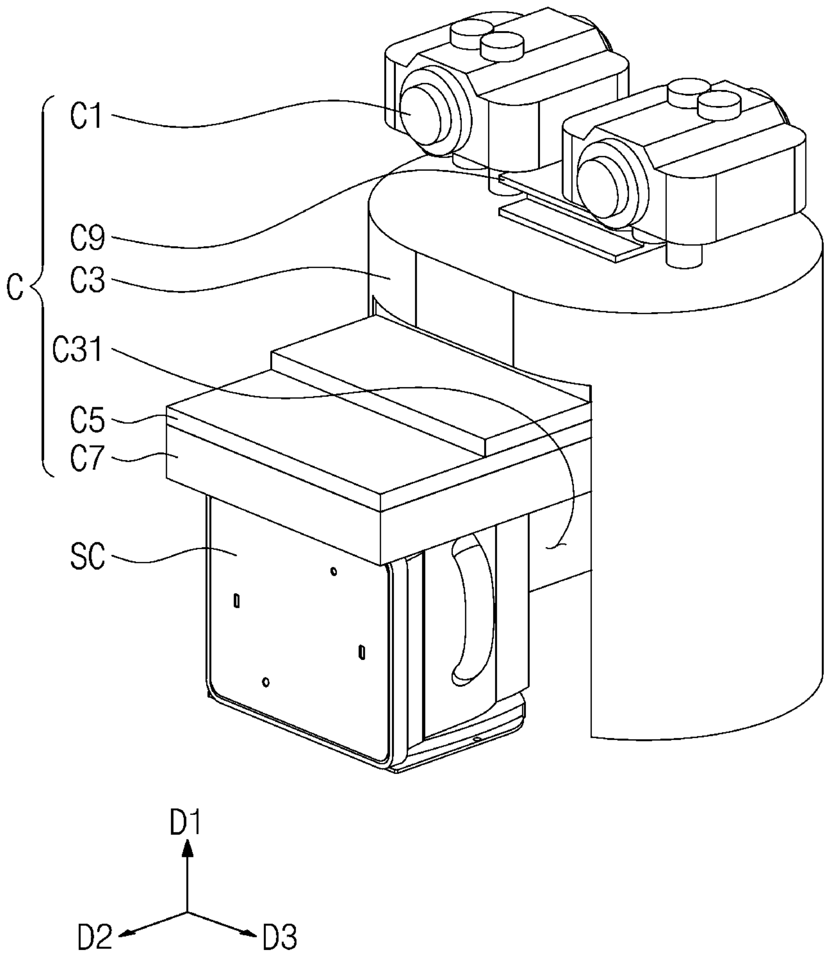
FIG. 8 is a perspective view illustrating an OHT coupled to a semiconductor carrier according to embodiments of the present disclosure.
Figure 9:
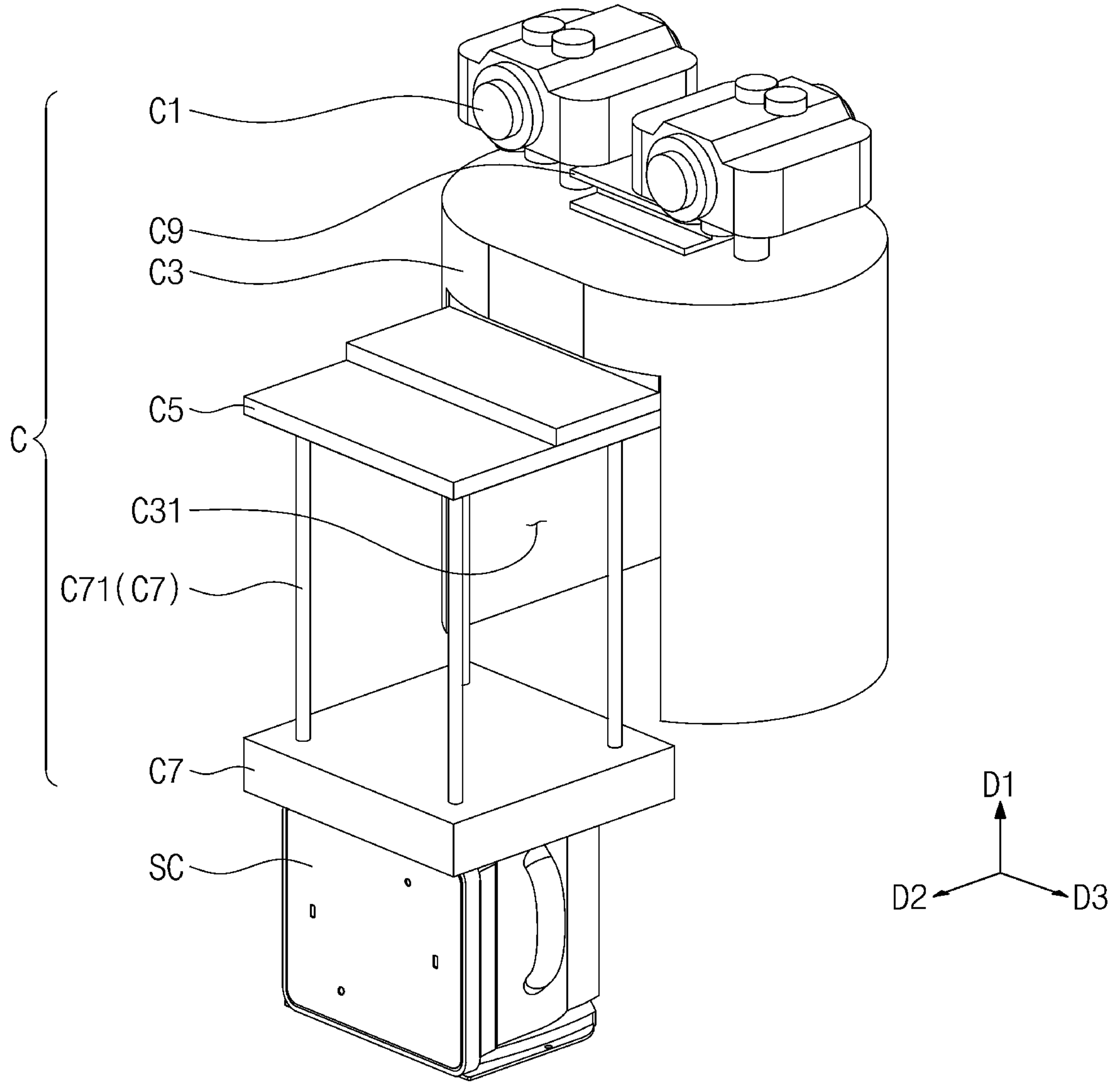
FIG. 9 is a perspective view illustrating an OHT coupled to a semiconductor carrier according to embodiments of the present disclosure.

FIG. 5, FIG. 6, and FIG. 7 are a perspective view, a side view, and a projection view illustrating the OHT C coupled to the semiconductor carrier SC according to embodiments of the present disclosure. FIG. 8 is a perspective view illustrating the OHT C coupled to the semiconductor carrier SC according to embodiments of the present disclosure. FIG. 9 is a perspective view illustrating the OHT C coupled to the semiconductor carrier SC according to embodiments of the present disclosure.

Referring to FIG. 5, FIG. 6, and FIG. 7, the semiconductor carrier SC and the OHT C may be provided. The semiconductor carrier SC may bear a substrate, such as a wafer, for transport and for producing a semiconductor. A plurality of substrates may be loaded on the semiconductor carrier SC. For example, the semiconductor carrier SC may include a front opening unified pod (FOUP) or a front opening shipping box (FOSB). However, the present disclosure is not limited thereto. The OHT C may be coupled to the semiconductor carrier SC. The OHT C may transport the semiconductor carrier SC. The OHT C may include a transport body C3, a transfer wheel C1 that may move the transport body along the travel rail, a coupling member C9 that may couple the OHT to the travel rail, a horizontal slider C5 that may extend from the transport body in a horizontal direction, and a gripper C7 that may be connected to the horizontal slider and may be moved in a vertical direction.

The transport body C3 may have an elliptical column shape. The transport body C3 may provide an interior space C31. However, the present disclosure is not limited thereto, and the transport body C3 may have various other shapes. For example, the transport body C3 may have a rectangular parallelepiped shape. Although not illustrated, the transport body C3 may include, for example, a collision preventing sensor, an obstacle detection sensor, or a wireless communication module. For example, the collision preventing sensor and the obstacle detection sensor may be used to safely transport the semiconductor carrier SC to a destination while not colliding with another OHT C or with an obstacle when the OHT C is moved. The OHT C may be controlled by communicating with a central controller by using the wireless communication module, regarding a location, a movement direction, and a speed of the OHT C. For example, the OHT C may be controlled by bi-directionally communicating with the central controller.

The transfer wheel C1 may be coupled to the transport body C3. The transfer wheel C1 may be located on the travel rail L. In more detail, the transfer wheel C1 may be located on an upper surface of the upper travel rail L3. The OHT C may be moved on the travel rail L when the transfer wheel C1 rolls along the upper surface of the upper travel rail L3 of the travel rail L. Accordingly, the OHT C may be moved along the travel rail L. For example, the OHT C may be moved along the travel rail L even when the travel rail L is deflected.

The coupling member C9 may be coupled to the transport body C3. Due to the coupling member C9, the OHT C may be coupled to the travel rail L. In more detail, the coupling member C9 and the lower travel rail L1 may be coupled to each other. The coupling member C9 may include a groove. For example, the groove of the coupling member C9 may cooperate with the lower travel rail L1, and the lower travel rail L1 may fit within the groove of the coupling member C9. More particularly, two of the lower travel rails L1 of the travel rail L may protrude toward each other in the central direction and may fit within respective grooves of the coupling member C9 on opposite sides of the coupling member C9. However, the present disclosure is not limited thereto.

Referring to FIG. 7 and FIG. 8, the horizontal slider C5 may be disposed within the interior space C31 of the transport body C3. In more detail, an upper surface of the horizontal slider C5 may be coupled to the transport body C3. The horizontal slider C5 may protrude from the interior space C31 in a stepped form. Accordingly, the horizontal slider C5 may move the semiconductor carrier SC in a horizontal direction. A degree by which the horizontal slider C5 protrudes from the transport body C3 may be changed. For example, the horizontal slider C5 may be moved into, and removed from, the interior space C31 of the transport body C3 along the second direction D2.

Referring to FIG. 7 and FIG. 9, the gripper C7 may be located on a lower side of the horizontal slider C5. The gripper C7 may be coupled to a lower surface of the horizontal slider C5. The semiconductor carrier SC may be coupled to a lower surface of the gripper C7. The gripper C7 may include a hoist C71. The gripper C7 may move the semiconductor carrier SC in the upward/downward direction by using the hoist C71. A movement direction and a location of the gripper C7 may be changed.

Figure 10:
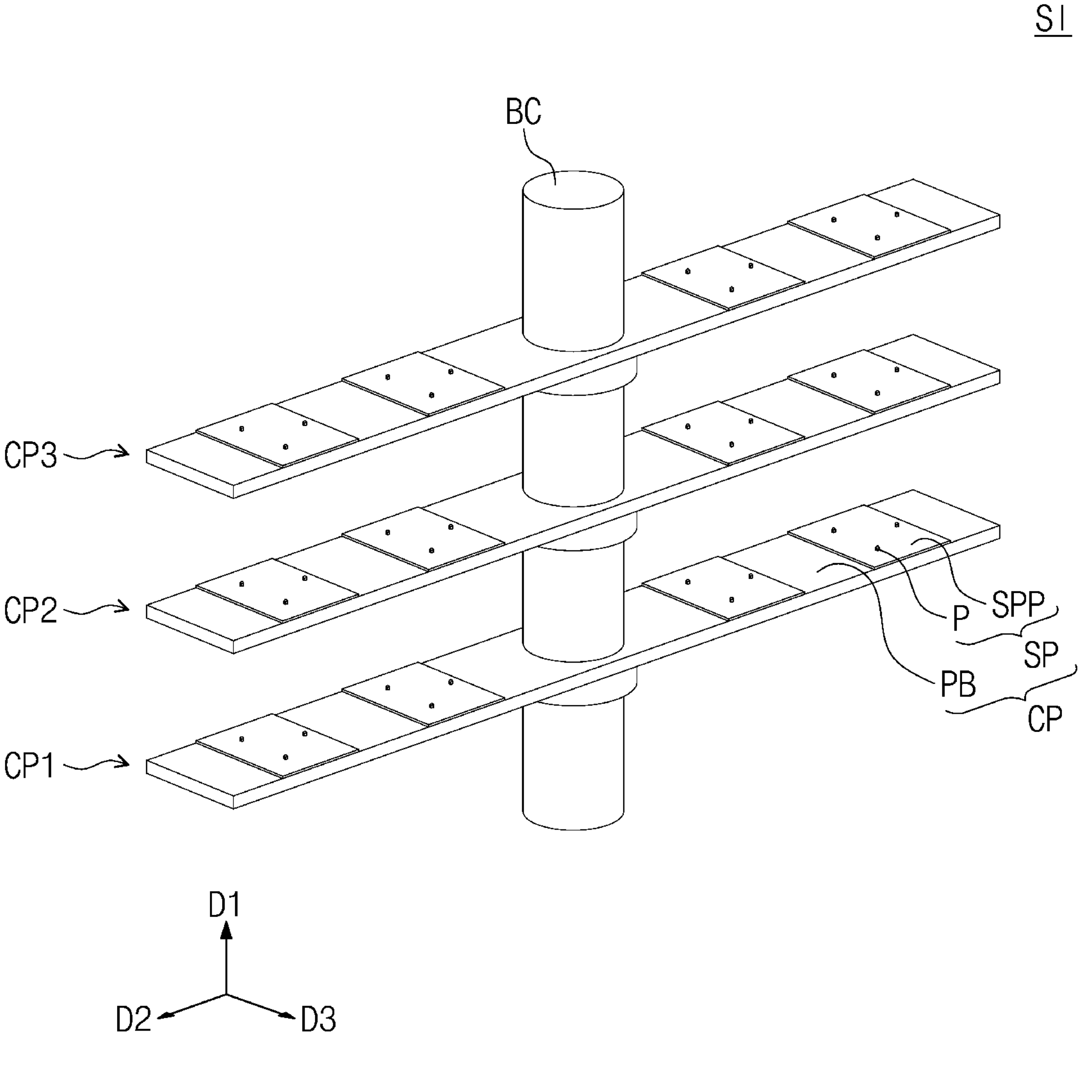
FIG. 10 is a perspective view illustrating a rotational interface according to embodiments of the present disclosure.
Figure 11:
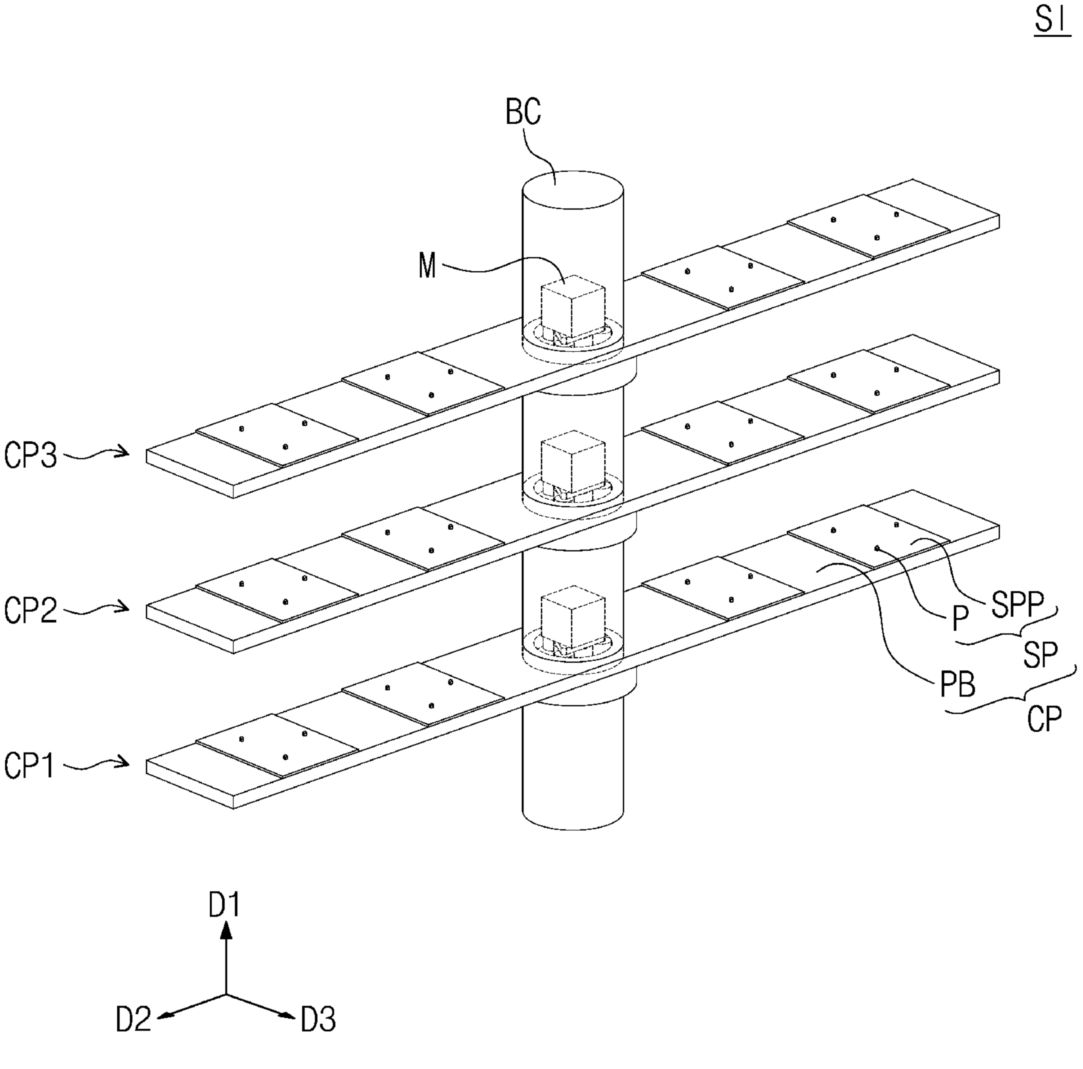
FIG. 11 is a perspective projection view illustrating a rotational interface according to embodiments of the present disclosure.
Figure 12:
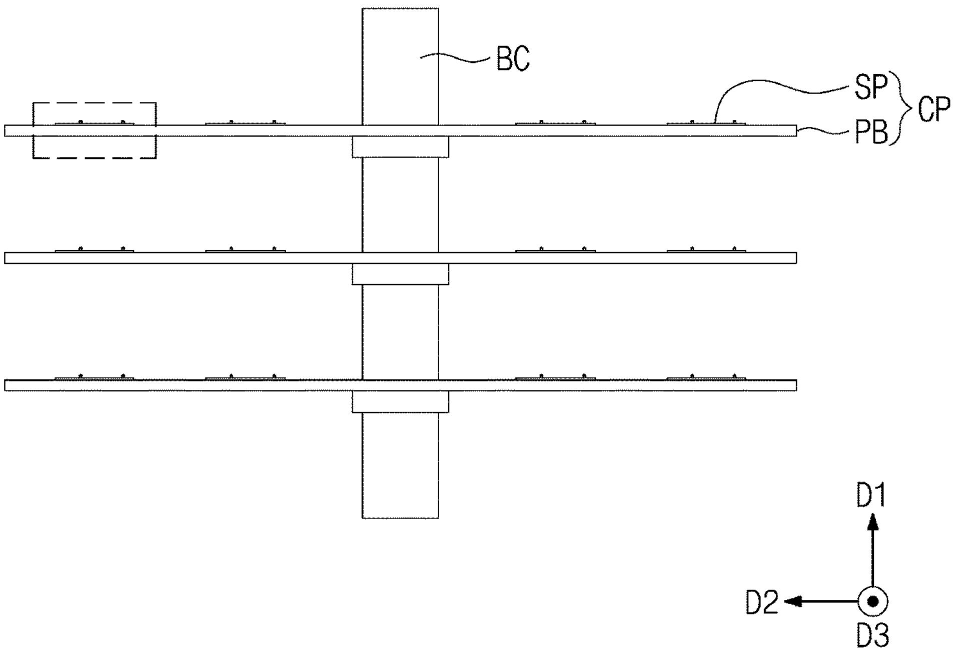
FIG. 12 is a front view illustrating a rotational interface according to embodiments of the present disclosure.
Figure 13:
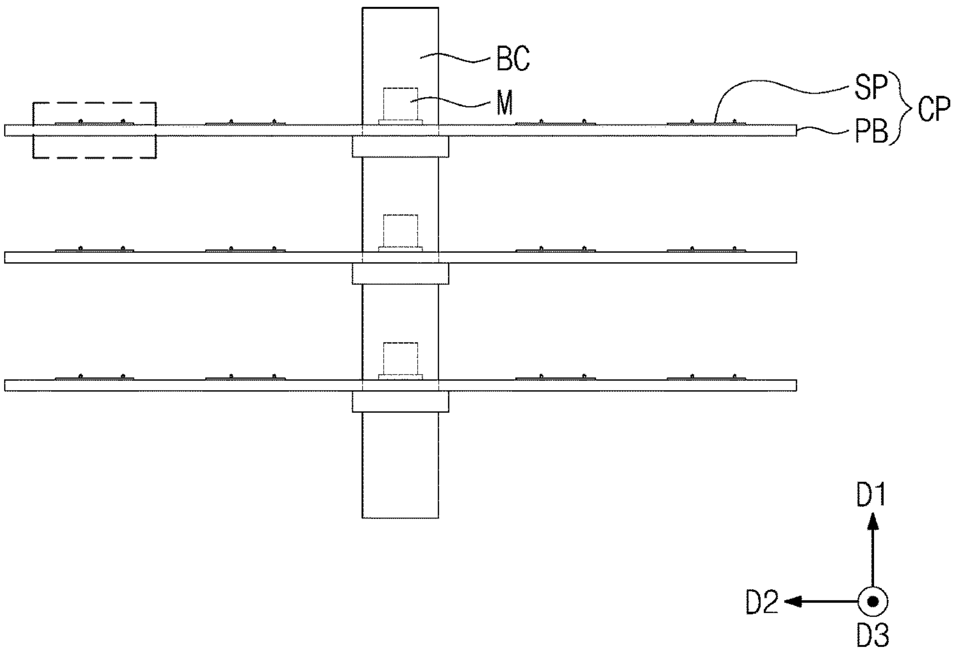
FIG. 13 is a front projection view illustrating a rotational interface according to embodiments of the present disclosure.
Figure 14:
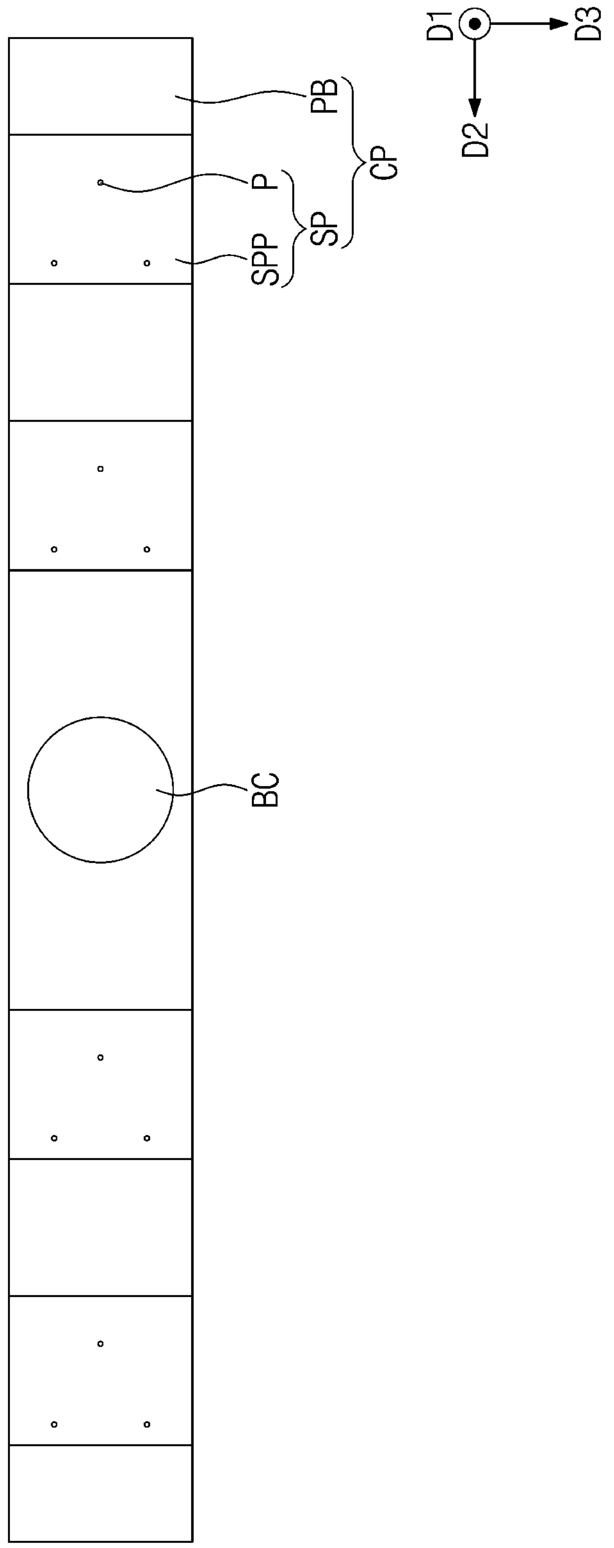
FIG. 14 is a plan view illustrating a rotational interface according to embodiments of the present disclosure.
Figure 15:
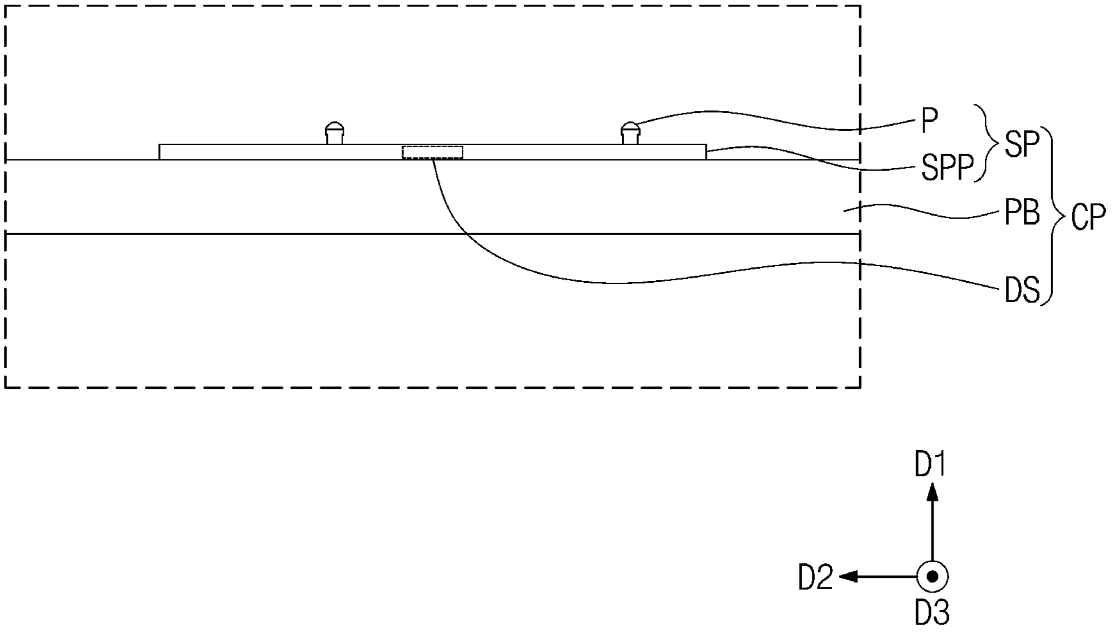
FIG. 15 is a partially enlarged view illustrating a carrier plate according to embodiments of the present disclosure.

FIG. 10 is a perspective view illustrating the rotational interface SI according to embodiments of the present disclosure. FIG. 11 is a perspective projection view illustrating the rotational interface SI according to embodiments of the present disclosure. FIG. 12 is a front view illustrating the rotational interface SI according to embodiments of the present disclosure. FIG. 13 is a front projection view illustrating the rotational interface SI according to embodiments of the present disclosure. FIG. 14 is a plan view illustrating the rotational interface SI according to embodiments of the present disclosure. FIG. 15 is a partially enlarged view illustrating a carrier plate according to embodiments of the present disclosure.

Referring to FIG. 10, FIG. 11, FIG. 12, FIG. 13, and FIG. 14, the rotational interface SI may be provided. The rotational interface SI may include a base column BC, a carrier plate CP, and a rotary unit M.

The base column BC may extend from the bottom G (see FIG. 2). For example, the base column BC may extend upward from the bottom G. The base column BC may include various shapes in a plan view. The term "plan view" used in the specification may mean a top view as illustrated in FIG. 14. The base column BC may include a polygonal shape, for example, a circular shape, a triangular shape, or a four-sided shape in the plan view. Other devices may be located in an interior of the base column BC. A lower surface of the base column BC may be fixed to the bottom G (see FIG. 2). An upper surface of the base column BC may be coupled to another fixing structure (not illustrated), which may fix the upper surface of the base column BC. However, the present disclosure is not limited thereto, and the upper surface of the base column BC may not be coupled to another fixing structure. A computer (CPU) (see FIG. 2) may be disposed in an interior of the base column BC. However, the present disclosure is not limited thereto, and the computer CPU may be located outside the base column BC. Rotation of the rotary unit M may be controlled by the computer.

Figure 23:
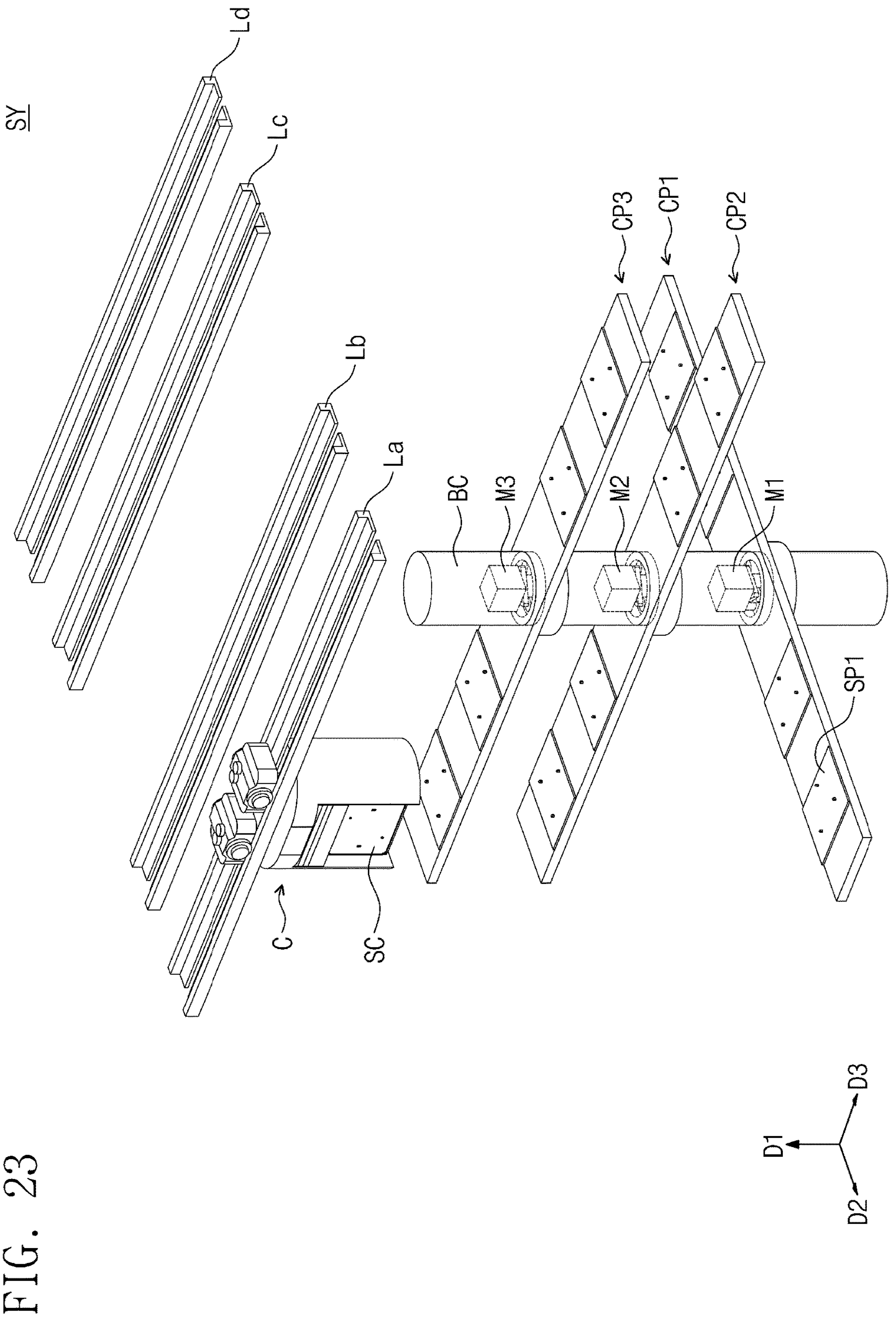
FIG. 23 is a perspective view illustrating a semiconductor manufacturing method according to FIG. 19.

Referring to FIG. 10, FIG. 11, FIG. 12, FIG. 13, FIG. 14, and FIG. 15, the carrier plate CP may be provided. The carrier plate CP may be connected to the base column BC. The carrier plate CP may be rotatable by the rotary unit M. For example, the carrier plate CP may be rotated by the rotary unit M (see FIG. 11 and FIG. 13). The carrier plate CP may include a plate body PB and a storage pot SP. A plurality of carrier plates CP may be provided. The plurality of carrier plates CP may be disposed to be spaced apart from each other in the vertical direction. The plurality of carrier plates CP may be rotated by the plurality of rotary units M, respectively. For example, any of the plurality of carrier plates CP may be rotated independently using respective ones of the plurality of rotary units M. In more detail, the number of the plurality of carrier plates CP may be 2 to 4. However, the present disclosure is not limited thereto, and the number of carrier plates may be variously implemented. As illustrated in FIG. 13, the plurality of carrier plates CP may be aligned in the vertical direction. As illustrated in FIG. 23, one or more of the carrier plates CP may be rotated and the plurality of carrier plates CP may be unaligned in the vertical direction. Hereinafter, unless particularly defined, the carrier plate CP will be regarded as being a single carrier plate for convenience unless explicitly noted.

The carrier plate CP may include a detection sensor DS. By the detection sensor DS, an interfering carrier plate may be detected. For example, a second carrier plate CP2 and a third carrier plate CP3 may be both be interfering carrier plate when the semiconductor carrier SC is to be placed on, or removed from, a first carrier plate CP1 in the plan view (see FIG. 22).

The plate body PB may extend in a horizontal direction. The plate body PB may be coupled to the base column BC. The plate body PB may be coupled to the rotary unit M. The plate body PB may be rotated by the rotary unit M. For example, the plate body PB may be rotated around the base column BC by the rotary unit M.

The storage pot SP may be located on the plate body PB. The storage pot SP may include a pot body SPP and a fixing pin P. The storage pot SP may have an upper surface that may support the semiconductor carrier SC. The upper surface of the storage pot SP may be substantially the same as an upper surface of the pot body SPP. A plurality of storage pots SP may be provided. The plurality of storage pots SP may be disposed on the plate body PB to be spaced apart from each other in a horizontal direction. Hereinafter, the plurality of storage pots SP will be regarded as being singular for convenience unless explicitly noted.

The fixing pin P of the storage pot SP may be located on an upper surface of the storage pot SP. The fixing pin P may fix the semiconductor carrier SC. The fixing pin P may fix the semiconductor carrier SC to the storage pot SP. An upper portion of the fixing pin P may have a rounded shape. A plurality of fixing pins P may be provided on one pot body SPP. For example, three fixing pins P may be provided on one pot body SPP. However, hereinafter, the fixing pins P will be described in the singular for convenience unless explicitly noted.

Figure 16:
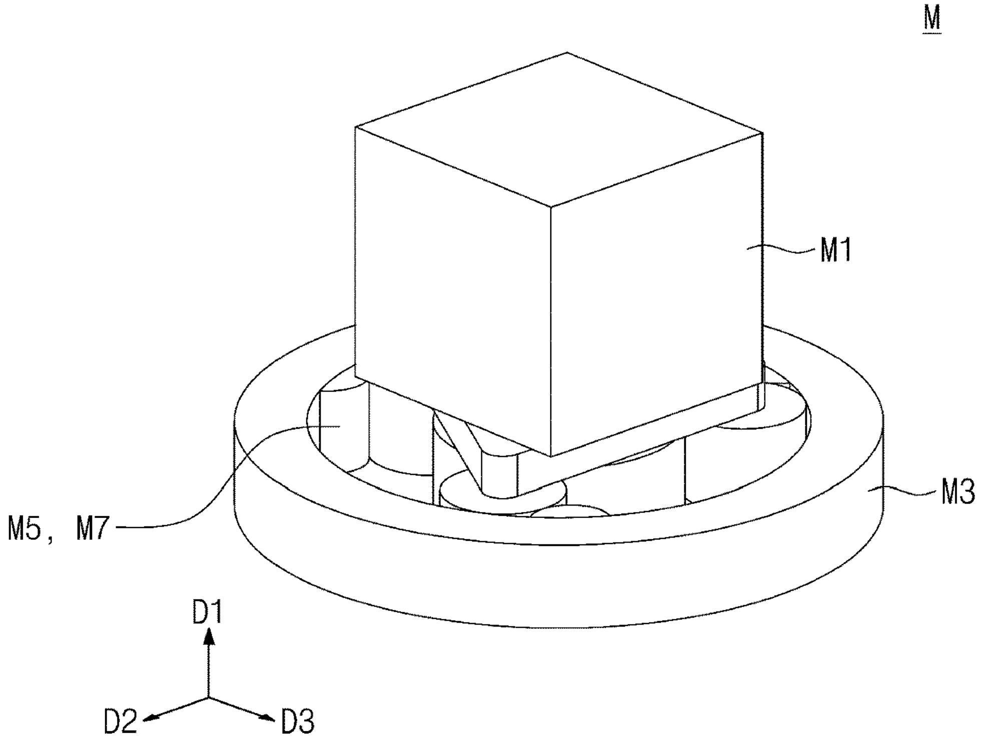
FIG. 16 is a perspective view illustrating a rotary unit according to embodiments of the present disclosure.
Figure 17:
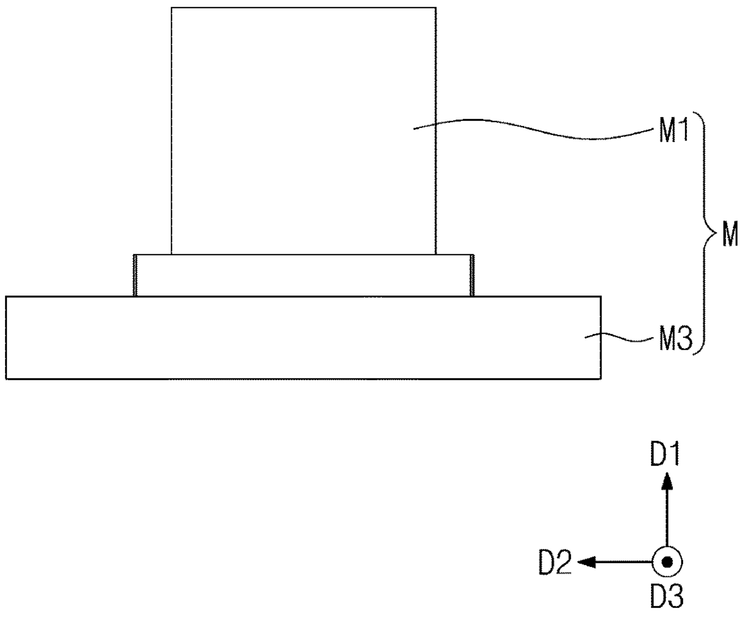
FIG. 17 is a front view illustrating a rotary unit according to embodiments of the present disclosure.
Figure 18:
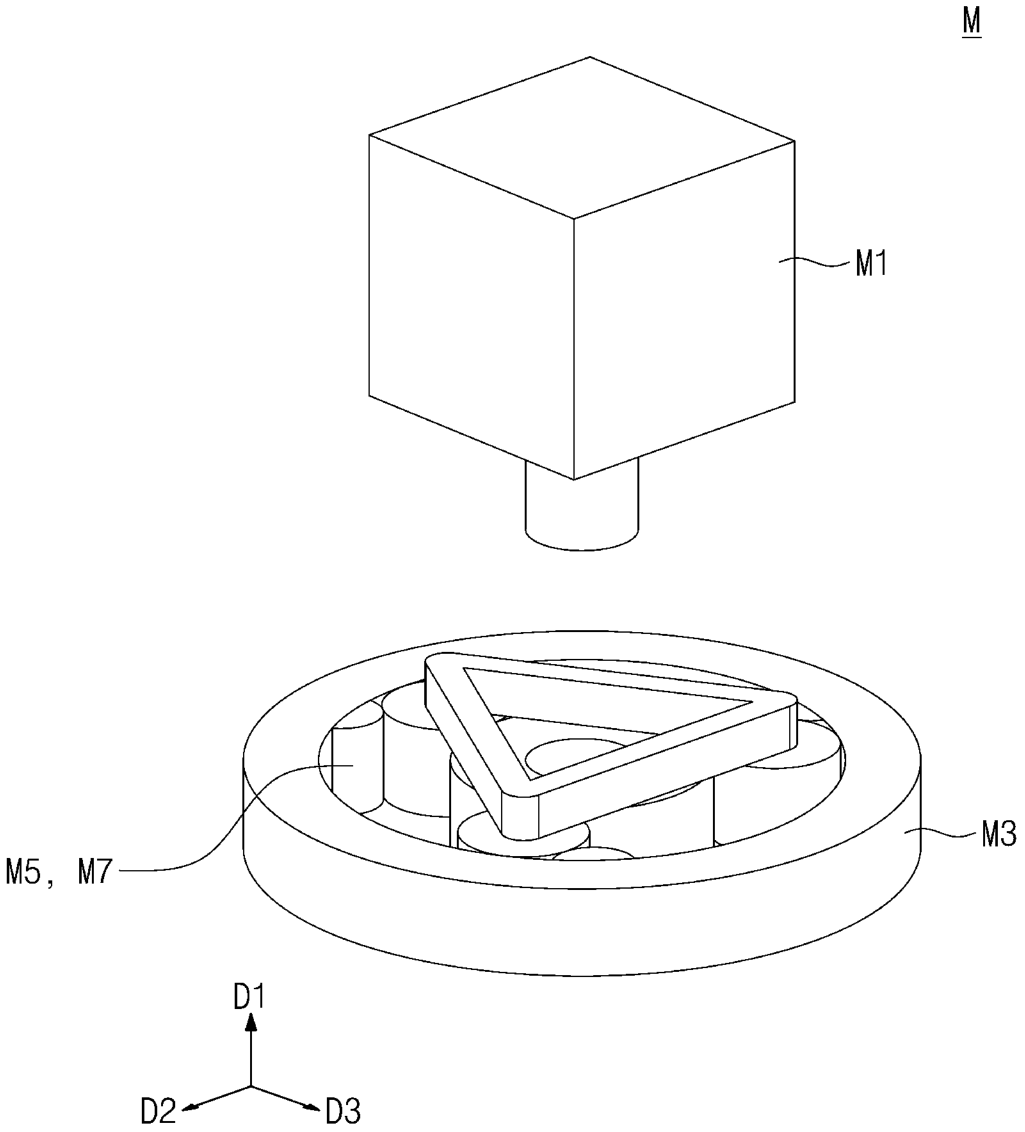
FIG. 18 is an exploded perspective view illustrating a rotary unit according to embodiments of the present disclosure.

FIG. 16 is a perspective view illustrating the rotary unit M according to embodiments of the present disclosure. FIG. 17 is a front view illustrating the rotary unit M according to embodiments of the present disclosure. FIG. 18 is an exploded perspective view illustrating the rotary unit M according to embodiments of the present disclosure.

The rotary unit M may be located in an interior of the base column BC. The rotary unit M may be coupled to the carrier plate CP. The rotary unit M may rotate the carrier plate CP. In other words, by the rotary unit M, power may be transmitted to the carrier plate CP (see FIG. 11 and FIG. 13), and the carrier plate CP may be rotated around the base column BC. The rotary unit M may include a motor M1 and a gear M3. The motor M1 may convert electric energy to power. The motor M1 may be coupled to the gear M3. The gear M3 may receive the power from the motor M1 and rotate the carrier plate CP. The gear M3 may include a planetary gear, a bevel gear, a spur gear, a helical gear, or the like. The rotary unit M may further include a damper M5 and/or an angle sensor M7. The damper M5 may be coupled to the gear M3. By the damper M5, an impact that may be generated when the rotary unit M is rotated may be reduced or eliminated. The damper M5 may include a material that may absorb an impact. In more detail, the damper M5 may include rubber. By using the angle sensor M7, the rotary unit M may detect a rotational angle of the carrier plate CP and/or the motor M1. According to a measured value output by the angle sensor M7, the rotation of the carrier plate CP may be controlled. By the angle sensor M7, it may be identified whether the carrier plate CP is rotated properly. For example, by the angle sensor M7, it may be identified whether the carrier plate CP is rotated according to a control signal. The angle sensor M7 may use a magnetic field, an electric field, a laser, or the like. In more detail, when the angle sensor M7 uses a laser, the angle sensor M7 may include a light emitting part and a location pin. When the light emitting part of the angle sensor M7 irradiates a laser and the location pin of the angle sensor M7 contacts the laser, the rotational angle of the rotary unit M may be measured.

Figure 19:
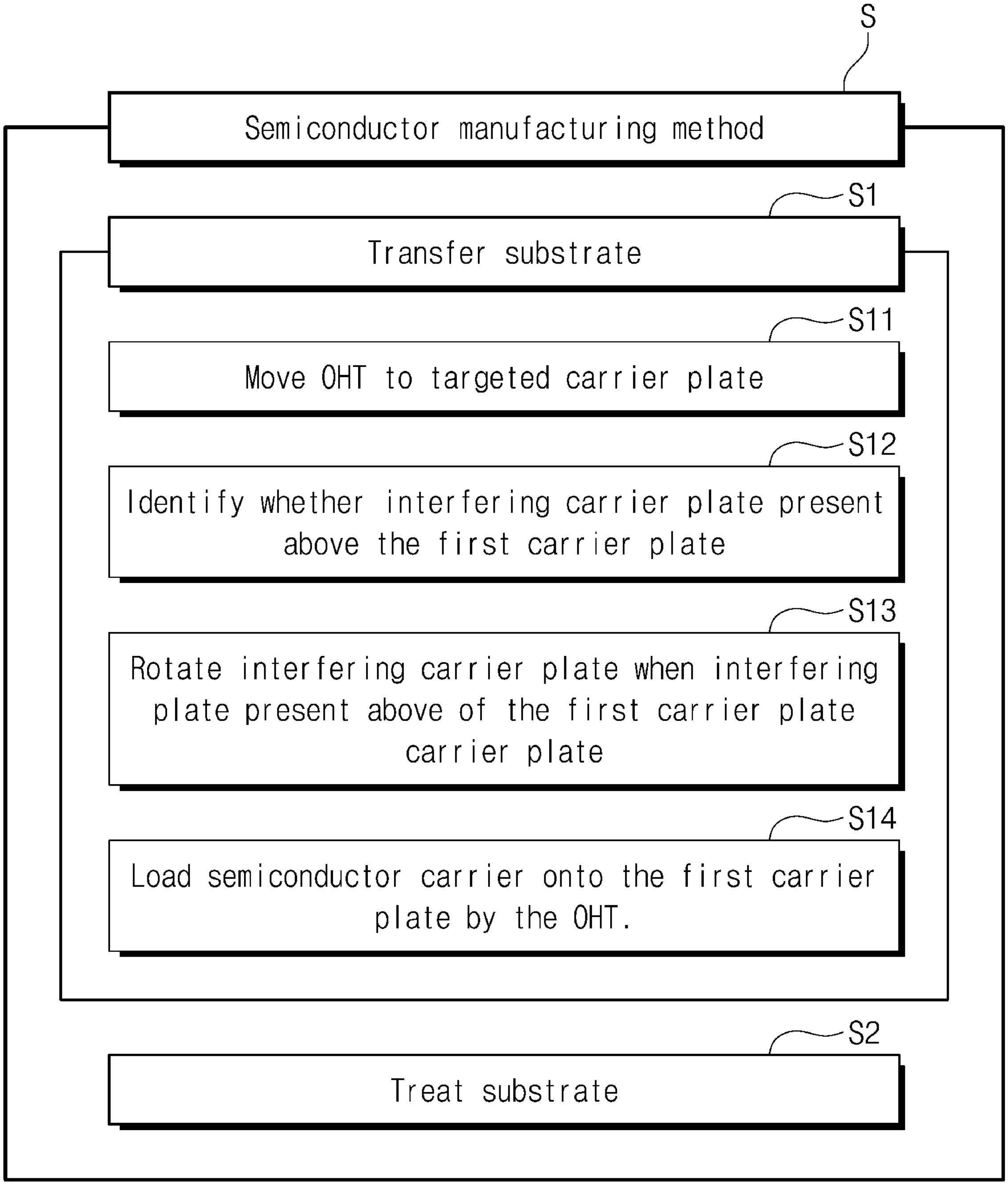
FIG. 19 is a flowchart illustrating a semiconductor manufacturing method according to embodiments of the present disclosure.

FIG. 19 is a flowchart illustrating a method S for manufacturing a semiconductor according to embodiments of the present disclosure.

Referring to FIG. 19, a method S for manufacturing a semiconductor may include operation S1 of transferring a substrate and operation S2 of treating the substrate. Operation S1 of transferring the substrate may include operation S11 of moving the OHT to the carrier plate CP1, which may be a targeted carrier plate (see FIG. 20 and FIG. 21), operation S12 of identifying whether the second carrier plate CP2 and/or the third carrier plate CP3 may be an interfering carrier plate (see FIG. 20 and FIG. 21) present above the first carrier plate CP1, operation S13 of rotating the second carrier plate CP2 and/or the third carrier plate CP3 when the second carrier plate CP2 and/or the third carrier plate CP3 is an interfering carrier plate present above of the first carrier plate CP1, which is the targeted carrier plate, and operation S14 of loading the semiconductor carrier SC onto the first carrier plate CP1, by the OHT C.

Hereinafter, a method S for manufacturing a semiconductor in FIG. 19 will be described in detail with reference to FIG. 20, FIG. 21, FIG. 22, FIG. 23, FIG. 24, FIG. 25, FIG. 26, and FIG. 27.

Figure 20:
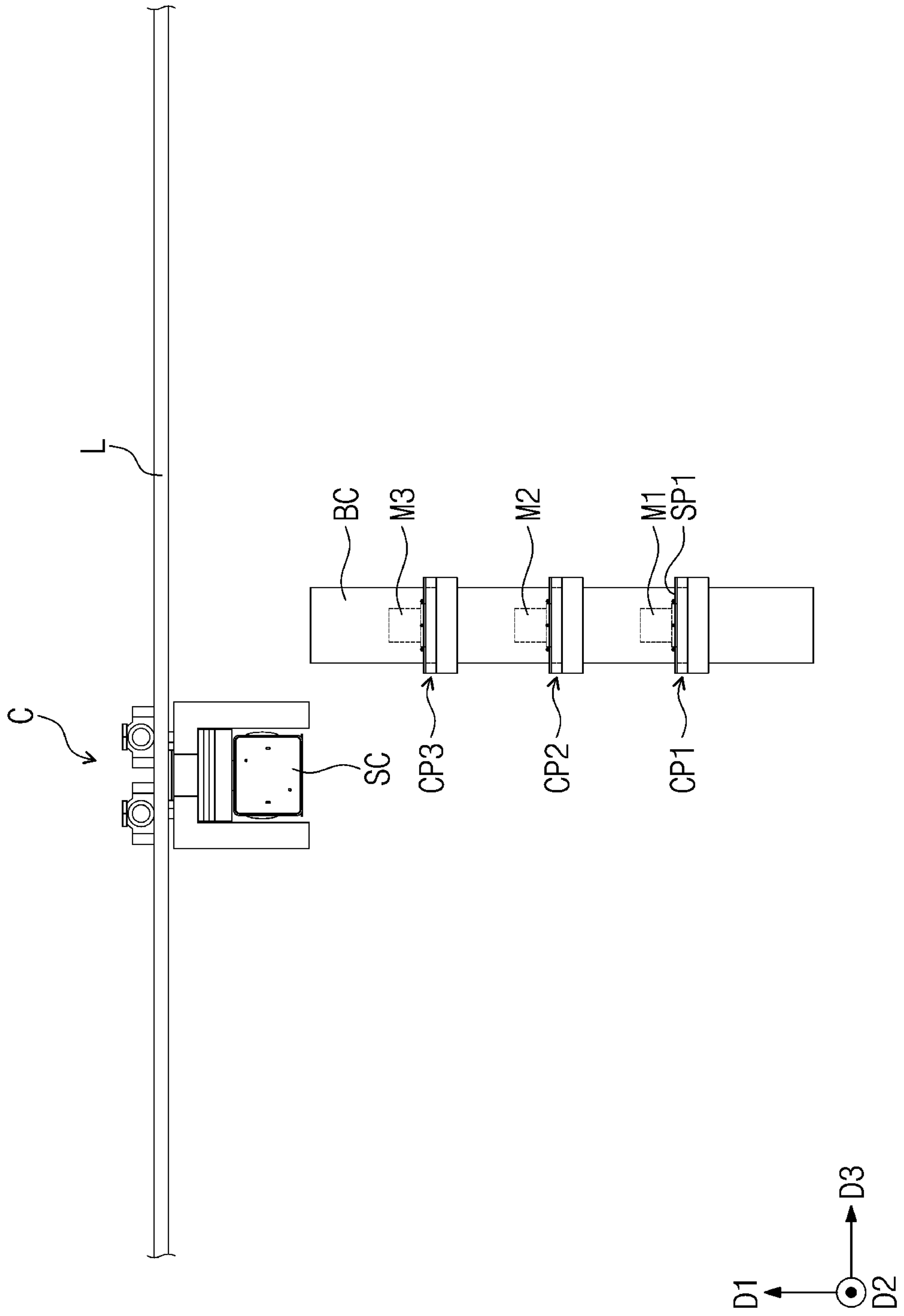
FIG. 20 is a side view illustrating a semiconductor manufacturing method according to FIG. 19.
Figure 21:
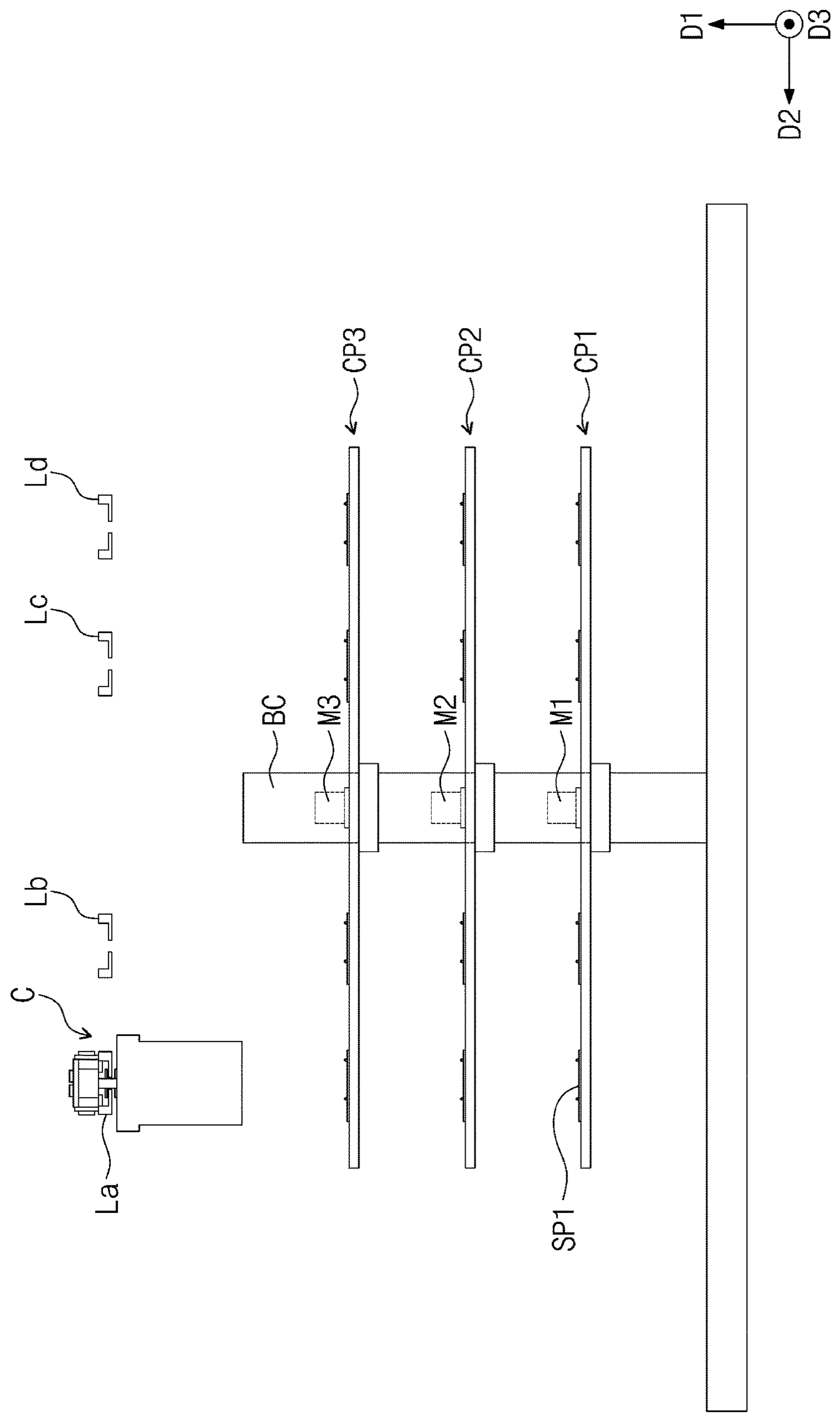
FIG. 21 is a front view illustrating a semiconductor manufacturing method according to FIG. 19.

FIG. 20 and FIG. 21 are side views of a rotational interface according to embodiments of the present disclosure for illustrating a method S for manufacturing a semiconductor according to FIG. 19.

Hereinafter, a configuration of the rotational interface SI will be described to describe a method S for manufacturing a semiconductor according to FIG. 19. A description of a configuration of the rotational interface SI is provided above, and thus may be omitted hereinafter.

Referring to FIG. 20 and FIG. 21, among the plurality of carrier plates and the plurality of rotary units, the first carrier plate CP1 and the first rotary unit M1 may be located on a lowermost portion of the rotational interface SI. The second carrier plate CP2 and the second rotary unit M2 located above the first carrier plate CP1 and the first rotary unit M1 may be located at an intermediate portion of the rotational interface SI. The carrier plate CP3 and the rotary unit M3 may be located above the second carrier plate CP2 and the second rotary unit M2 may be located at a uppermost portion of the rotational interface SI.

Referring to FIG. 20 and FIG. 21, the targeted carrier plate may be the first carrier plate CP1. The operation of moving the first OHT C onto the first carrier plate CP1 may include an operation of moving the first OHT C on to the first storage pot SP1, which may be a targeted storage pot for purposes of further description and convenience.

In the described case, the targeted carrier plate is the first carrier plate CP1, the second carrier plate CP2 and/or the third carrier plate CP3 may be an interfering carrier plate. Hereinafter, the interfering carrier plate will be referred to as the second carrier plate CP2 and/or the third carrier plate CP3. The first carrier plate CP1, the second carrier plate CP2, and the third carrier plate CP3 may be rotated by the first rotary unit M1, the second rotary unit M2, and the third rotary unit M3, respectively.

Referring to FIG. 20 and FIG. 21, operation S11 may include moving the first OHT C to the first carrier plate CP1, which may be a targeted carrier plate. The first OHT C, to which the semiconductor carrier SC is coupled may be moved along the first travel rail La. The travel rail L may have a linear or curved shape. The first travel rail La may move the first OHT C in the horizontal direction. The first OHT C may be located on the first storage pot SP1. The first OHT C may be stopped when it is located at the first carrier plate CP1. In more detail, the first OHT C may be stopped when it is located above the first storage pot SP1.

Figure 22:
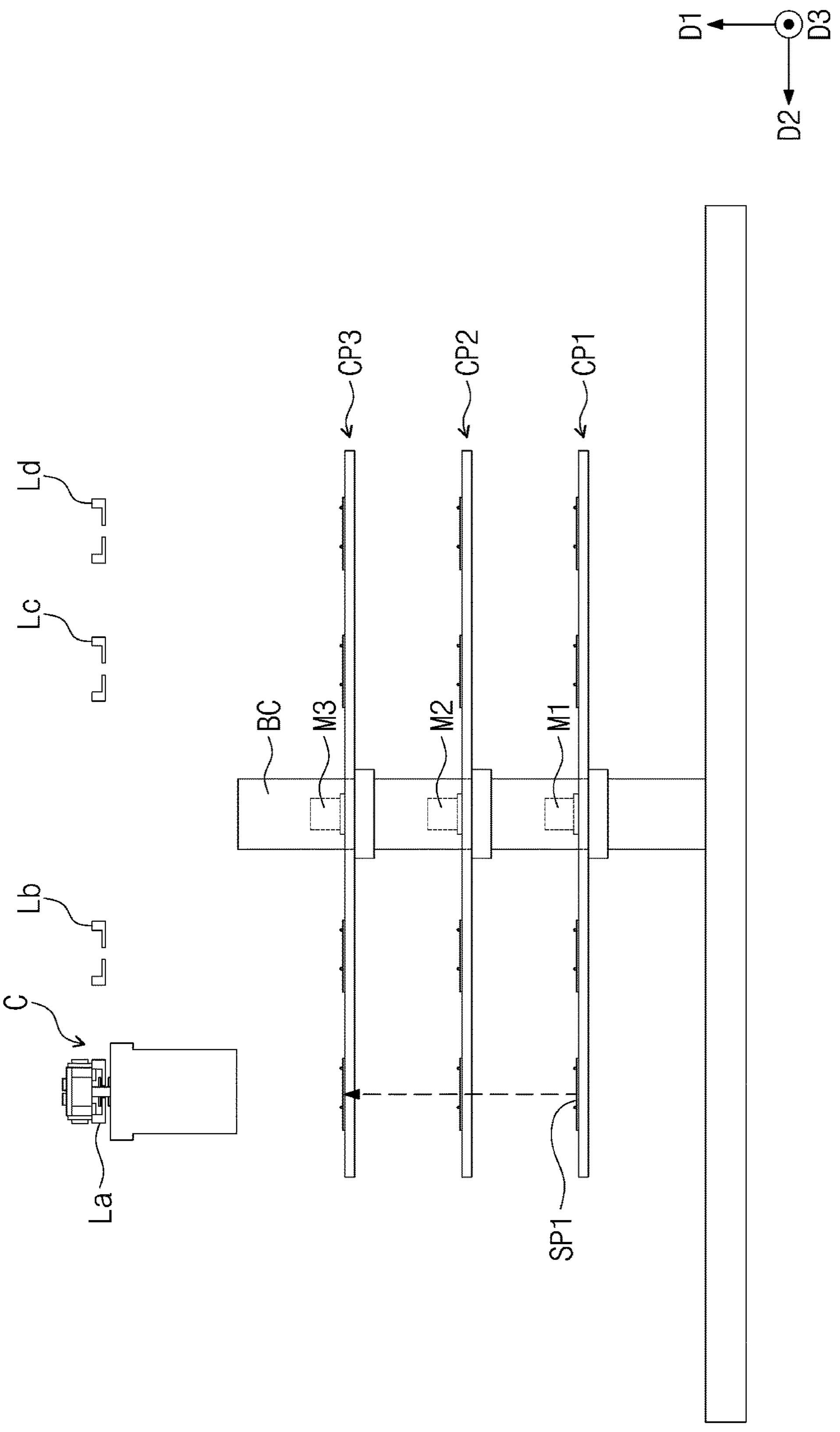
FIG. 22 is a front view illustrating a semiconductor manufacturing method according to FIG. 19.

FIG. 22 is a front view of a rotational interface according to embodiments of the present disclosure for illustrating a method S for manufacturing a semiconductor according to FIG. 19.

Referring to FIG. 22, operation S12 may include identifying whether an interfering carrier plate, for example, the second carrier plate CP2 and/or the third carrier plate CP3, is present above the first carrier plate CP1 in the plan view. One or more of the carrier plates may include a detection sensor DS that may determine whether an interfering object is present (see FIG. 15). In more detail, the detection sensor DS may identify whether an interfering carrier plate is present above the first storage pot SP1 in the plan view.

Figure 24:
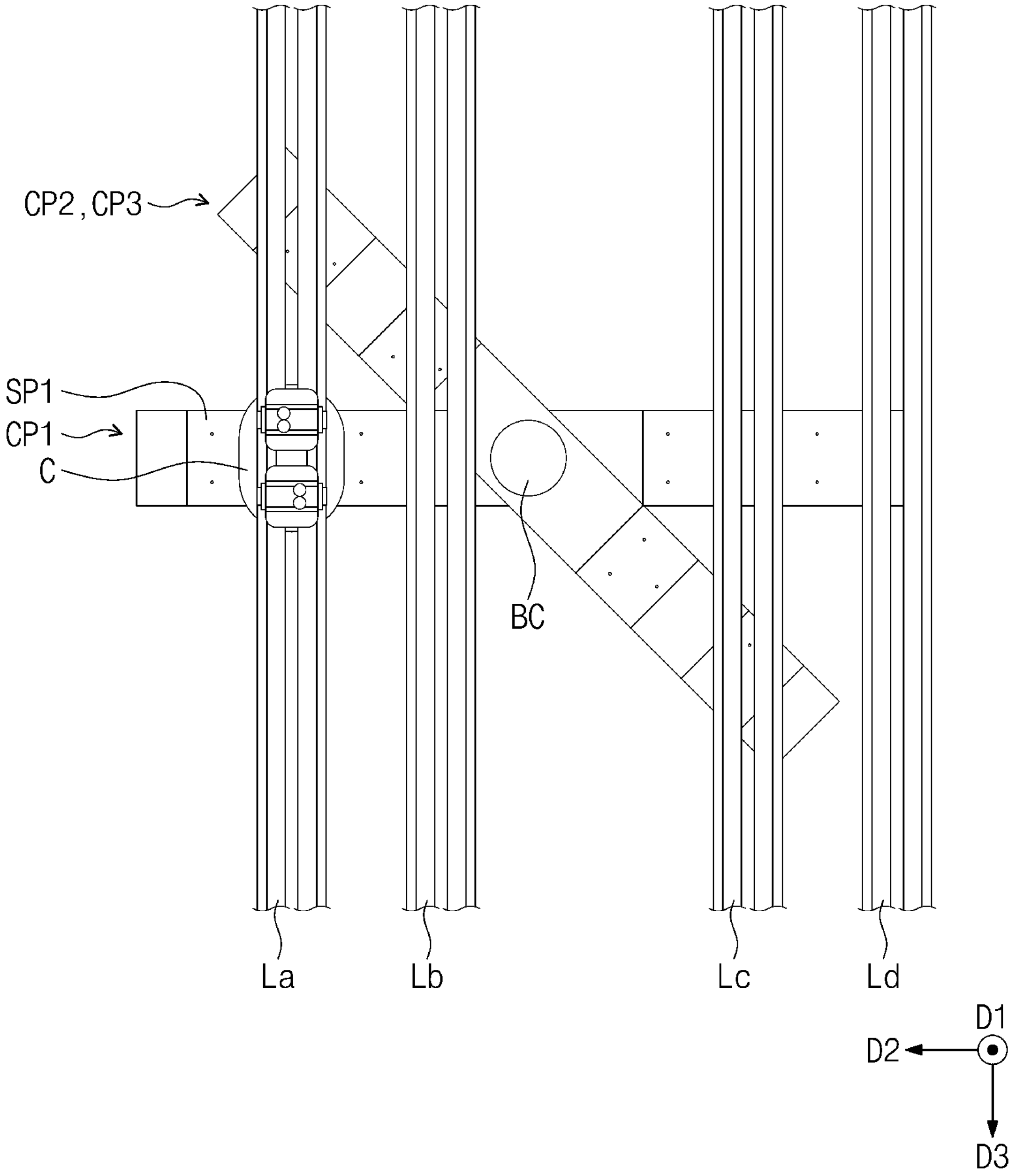
FIG. 24 is a plan view illustrating a semiconductor manufacturing method according to FIG. 19.

FIG. 23 and FIG. 24 are a perspective view and a plan view of a rotational interface according to embodiments of the present disclosure for illustrating a method S for manufacturing a semiconductor according to FIG. 19.

Referring to FIG. 23 and FIG. 24, an operation S13 may include rotating the second carrier plate CP2 and/or the third carrier plate CP3 when identified as an interfering carrier plate, by the detection sensor DS. The second carrier plate CP2 and/or the third carrier plate CP3 may be identified as an interfering carrier plate when present above the first carrier plate CP1. Rotational directions and rotational angles of the first carrier plate CP1, the second carrier plate CP2, and the third carrier plate CP3 may be controlled by a computer (not illustrated). The second rotary unit M2 and/or the third rotary unit M3 may be controlled by the computer when an interfering carrier plate is present above the first carrier plate CP1 in the plan view such that the second carrier plate CP2 and/or the third carrier plate CP3 may be rotated. In more detail, when the computer rotates the second rotary unit M2 and/or the third rotary unit M3, the second carrier plate CP2 and/or the third carrier plate CP3 may be unaligned from the first storage pot SP1 in the plan view, and may not interfere with access to the first storage pot SP1. For example, when the second carrier plate CP2 and/or the third carrier plate CP3 may be unaligned with the first carrier plate CP1, the first storage pot SP1 may be accessed by the semiconductor carrier SC.

In a case where the first carrier plate CP1, the second carrier plate CP2, and the third carrier plate CP3 may be rotated at least 180 degrees, travel rails and OHT on a side of the base column BC may be omitted. For example, the OHT C may have access to the first storage pot SP1 and a fourth storage pot disposed opposite to the first storage pot SP1 on the first carrier plate CP1. In this case, the fourth travel rail Ld may be omitted. Similarly, the third travel rail Lc may be omitted and an OHT on the second travel rail Lb may have access to a second storage pot and a third storage pot on the first carrier plate CP1 and disposed opposite to each other with reference to the base column BC.

Figure 25:
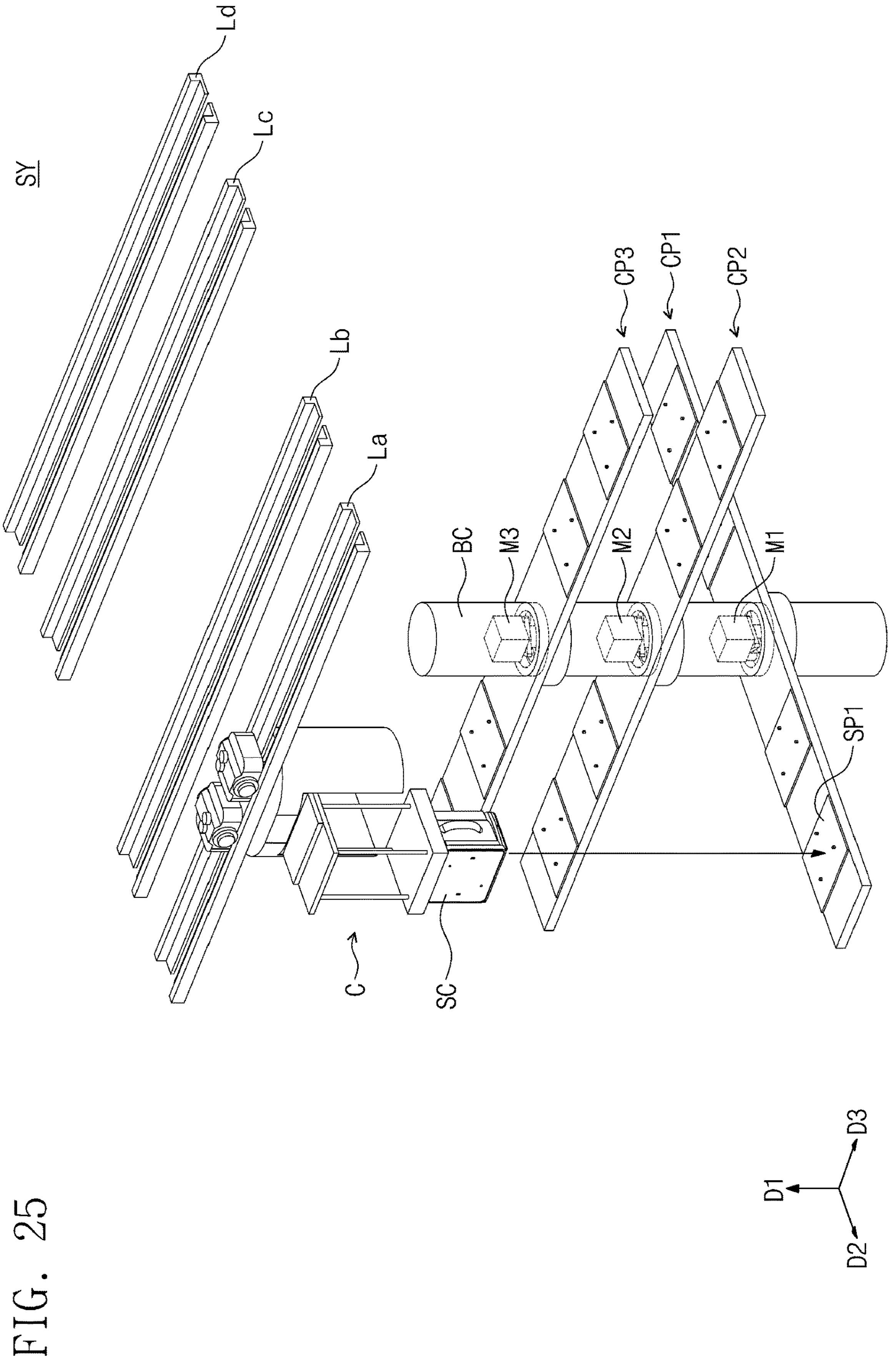
FIG. 25 is a perspective view illustrating a semiconductor manufacturing method according to FIG. 19.

FIG. 25 is a perspective view of a rotational interface according to embodiments of the present disclosure for illustrating a method S for manufacturing a semiconductor according to FIG. 19.

Referring to FIG. 25, operation S14 may include loading the semiconductor carrier SC, by the first OHT C. When the first OHT C is located on the first storage pot SP1 and the second carrier plate CP2 and/or the third carrier plate CP3 may be rotated, whereby the interfering carrier plate(s) is/are not present above the first storage pot SP1, and the semiconductor carrier SC may be moved in the horizontal direction by the horizontal slider C5. The semiconductor carrier SC may be lowered by the gripper C7 to be located on an upper surface of the first storage pot SP1. In more detail, as the hoist C71 may extend from the gripper C7 in the vertical direction, the semiconductor carrier SC may be moved in a vertically downward direction.

Figure 26:
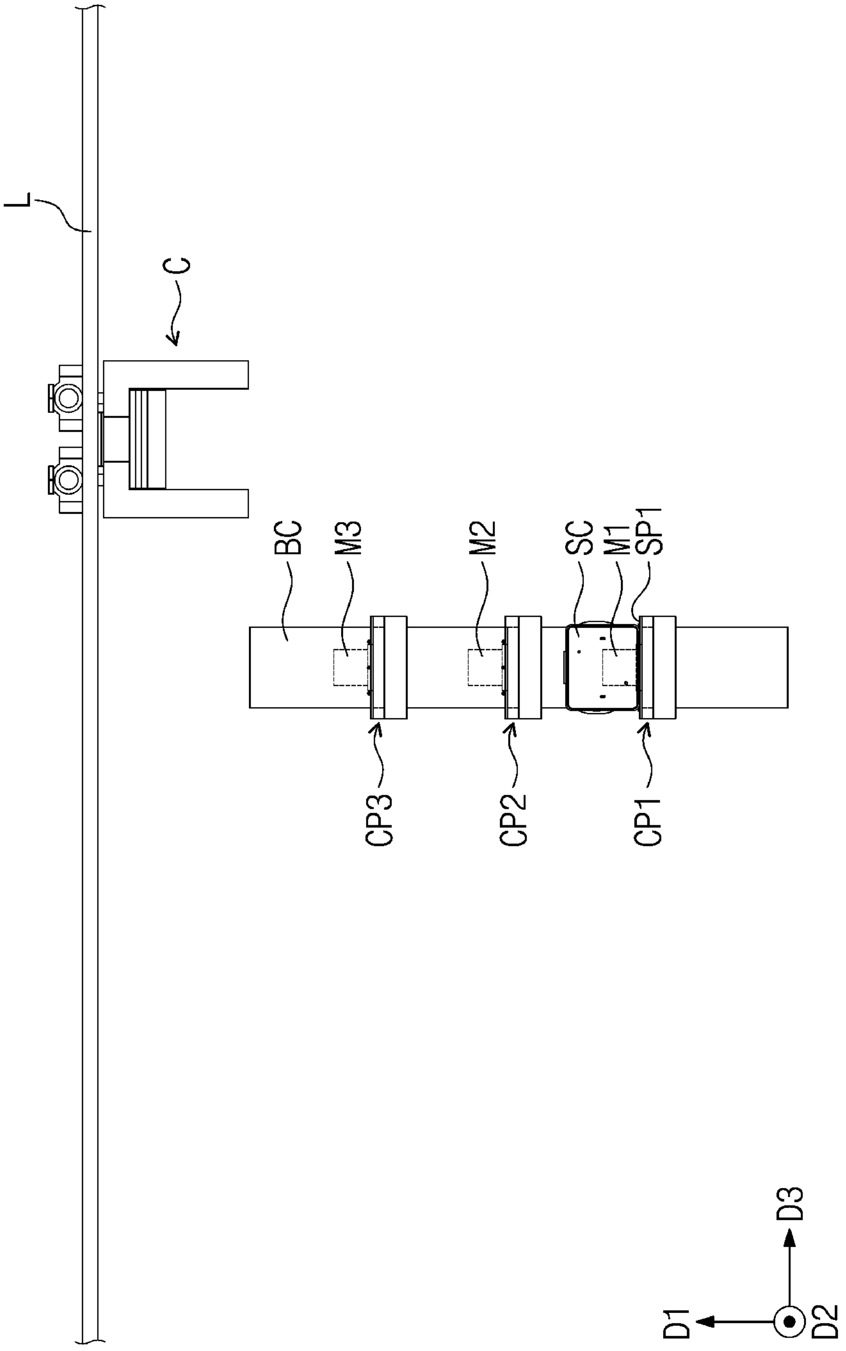
FIG. 26 is a side view illustrating a semiconductor manufacturing method according to FIG. 19.
Figure 27:
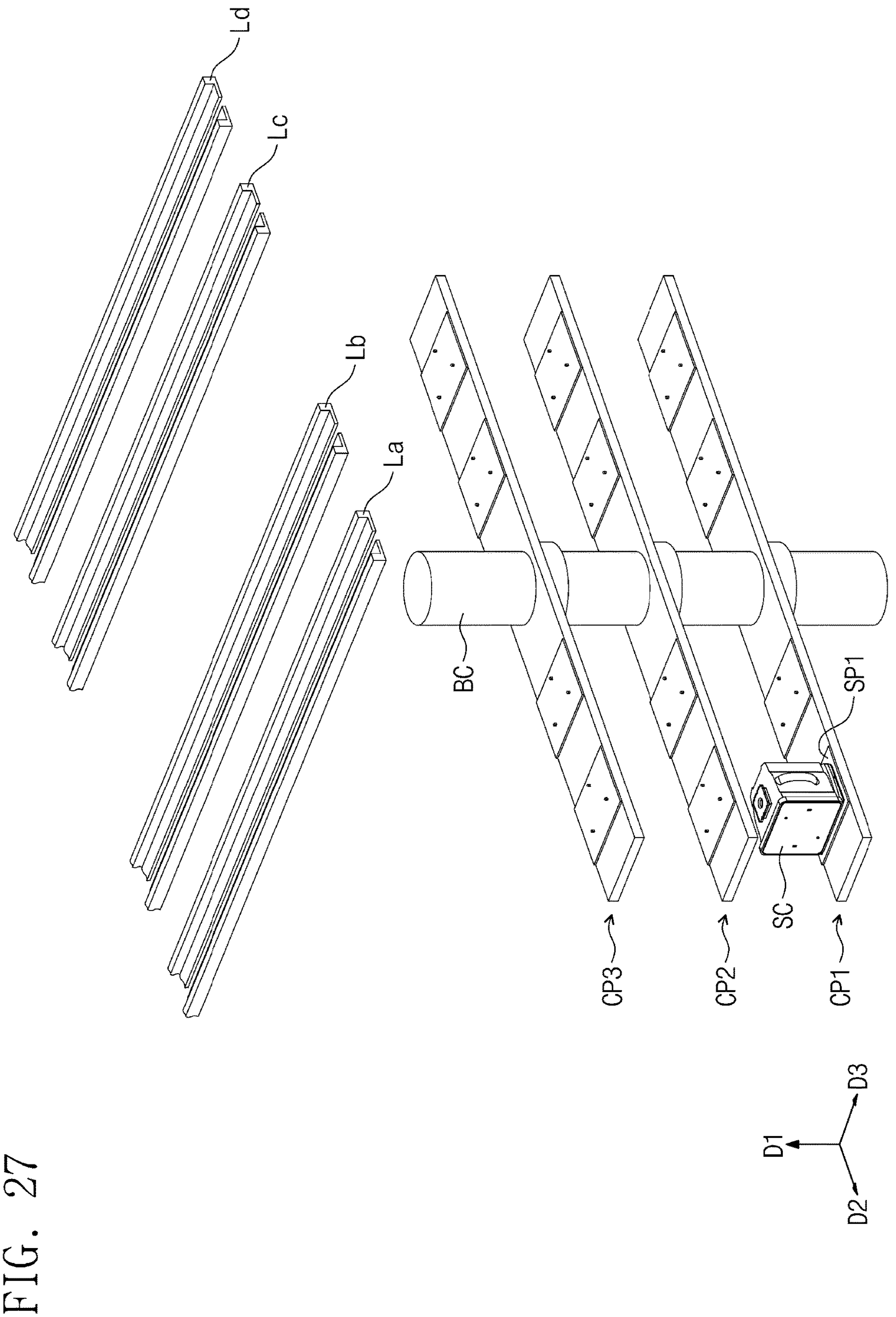
FIG. 27 is a perspective view illustrating a semiconductor manufacturing method according to FIG. 19.

FIG. 26 is a side view of a rotational interface according to embodiments of the present disclosure for illustrating a method S for manufacturing a semiconductor according to FIG. 19. FIG. 27 is a perspective view of a rotational interface according to embodiments of the present disclosure for illustrating a method S for manufacturing a semiconductor according to FIG. 19.

Operation S1 of transferring the substrate may further include an operation of loading the semiconductor carrier SC onto the first storage pot SP1, by the first OHT C, and rotating the second carrier plate CP2 and/or the third carrier plate CP3 to an original, aligned, state, and an operation of picking up and moving the semiconductor carrier SC located by the first OHT, by a second OHT (not illustrated) that is different from the first OHT C.

Referring to FIG. 26 and FIG. 27, an operation of loading the semiconductor carrier SC onto the first storage pot SP1, by the first OHT C, and rotating the second carrier plate CP2 and/or the third carrier plate CP3 to an original, aligned, state may be provided. After loading the semiconductor SC, the first OHT C may be moved to another destination along the first travel rail La. The operation of rotating the second carrier plate CP2 and/or the third carrier plate CP3 to the original state may be performed by rotating the second rotary unit M2 and/or the third rotary unit M3, by the computer.

Although not illustrated, the operation of picking up the semiconductor carrier SC, by the second OHT, which may be similar to operation S14 of loading the semiconductor carrier SC, by the first OHT C, may include an operation of rotating at least one of the second carrier plate CP2 or the third carrier plate CP3 when the second carrier plate CP2 and/or the third carrier plate CP3 is an interfering plate, for example, when the semiconductor carrier SC is to be placed on the first carrier plate CP1. The second OHT may be an OHT on the second travel rail Lb that is different from the first travel rail La. The first carrier plate CP1 may be rotated by the first rotary unit M1 such that the second OHT may pick up the semiconductor carrier SC, whereby the semiconductor carrier SC may be located on a lower side of one of the travel rails (e.g., the second travel rail Lb).

Operation S2 of treating the substrate may include at least one of manufacturing of a wafer, oxidation, photolithography, etching, deposition, metal wiring, a test, or packaging.

According to the rotational interface according to embodiments of the present disclosure, the carrier transfer system including the same, and the semiconductor manufacturing method by using the same, an area of a bottom occupied by the semiconductor carrier interface may be reduced. As compared with a conventional stocker that performs both functions of storing and transferring a semiconductor carrier, the rotational interface may function to move the semiconductor carrier to an OHT that is moved to another process while reducing the function of storing the semiconductor carrier, and thus the area of the bottom occupied by the semiconductor carrier interface may be significantly reduced. In more detail, the area of the bottom occupied by the rotational interface may be reduced by about 90% or more as compared with the conventional stocker.

According to the rotational interface according to embodiments of the present disclosure, the carrier transfer system including the same, and the semiconductor manufacturing method by using the same, a rate of transfer per unit time may be increased. In more detail, the rate of transfer per unit time of the rotational interface may be increased by about 80% or more as compared with the stocker.

According to the rotational interface according to embodiments of the present disclosure, the carrier transfer system including the same, and the semiconductor manufacturing method by using the same, costs may be reduced. For example, the rotational interface may be rotated about 180 degrees in relation to the OHT, and the OHT may have access to two end portions of each carrier plate and two storage pots at each end portion, even in a case where the OHT is on a single travel rail.

According to the rotational interface, the carrier transfer system including the same, and the semiconductor manufacturing method using the same, a weight of the semiconductor carrier interface may be reduced. For example, storage pots may be efficiently arranged on the carrier plates, which may result in a weight savings of the semiconductor carrier interface. In another case, the number of travel rails may be reduced where the carrier plates may be rotated in relation to the OHT.

According to the rotational interface, the carrier transfer system including the same, and the semiconductor manufacturing method using the same, the semiconductor carrier interface may be easily installed.

According to the rotational interface, the carrier transfer system including the same, and the semiconductor manufacturing method using the same, a transfer speed and a capacity of the semiconductor carrier may be increased.

According to the rotational interface, the carrier transfer system including the same, and the semiconductor manufacturing method using the same, installation costs of the semiconductor carrier interface may be reduced.

The effects of the present disclosure are not limited to the above-mentioned ones, and other unmentioned effects will be clearly understood by an ordinary person in the art from the detailed description.

Although embodiments of the present disclosure have been described with reference to the accompanying drawings until now, it may be understood by an ordinary person in the art, to which the present disclosure pertains, that the present disclosure may be carried out in other detailed forms while the technical spirits or essential features are not changed. Therefore, it should be understood that embodiments described in the detailed description and illustrated in the drawings are exemplary and not restrictive in all aspects.

What is claimed is:

1. A rotational interface comprising:
- a base column extending in a first direction;
- a rotary unit; and
- a carrier plate longitudinally extending from the base column in a second direction intersecting the first direction, wherein the carrier plate has a length in the second direction greater than a width in a third direction intersecting the second direction,
- wherein the carrier plate includes:
  - a plate body longitudinally extending and coupled to the base column; and
  - a plurality of storage pots disposed on the plate body and each having an upper surface,
- wherein each of the plurality of storage pots includes a fixing pin located on the upper surface thereof and configured to fix a semiconductor carrier to the plate body,
- wherein the rotational interface further comprises a plurality of carrier plates, including the carrier plate, and a plurality of rotary units, including the rotary unit,
- wherein the plurality of carrier plates are spaced apart from each other in the first direction, and
- wherein the plurality of carrier plates are rotatable by the plurality of rotary units, respectively.

2. The rotational interface of claim 1, wherein the rotary unit includes:
- a motor; and
- a gear configured to transmit power of the motor to the carrier plate.

3. The rotational interface of claim 2, wherein the gear includes a planetary gear.

4. The rotational interface of claim 2, wherein the rotary unit includes a damper configured to absorb an impact.

5. The rotational interface of claim 2, wherein the rotary unit includes an angle sensor configured to detect a rotational angle of the carrier plate.

6. The rotational interface of claim 1, wherein an upper portion of the fixing pin has a rounded shape.

7. The rotational interface of claim 1, wherein the plurality of carrier plates includes between 2 to 4 rotary plates.

8. The rotational interface of claim 1, wherein at least one of the plurality of carrier plates includes a detection sensor which detects an interfering carrier plate among the plurality of carrier plates.

9. A carrier transfer system comprising:
- a travel rail;
- an overhead hoist transport movably coupled to the travel rail; and
- a rotational interface,
- wherein the rotational interface comprises:
  - a base column extending in a first direction;
  - a rotary unit; and
  - a carrier plate longitudinally extending in a second direction intersecting the first direction from the base column and connected to the rotary unit,
- wherein the carrier plate has a length in the second direction greater than a width in a third direction intersecting the second direction,
- wherein the carrier plate includes a plate body coupled to the base column and extending in the second direction,
- wherein the carrier transfer system further comprises a plurality of carrier plates, including the carrier plate, and
- wherein the plurality of carrier plates are spaced apart from each other in the first direction.

10. The carrier transfer system of claim 9, wherein the rotational interface further includes a computer located in an interior of the base column and configured to control rotation of the rotary unit.

11. The carrier transfer system of claim 9, wherein the rotary unit includes:
- a motor configured to rotate the carrier plate; and a planetary gear configured to transmit power of the motor to the carrier plate.

12. The carrier transfer system of claim 9, wherein the carrier plate further includes a storage pot located on the plate body and having an upper surface, and wherein the storage pot includes a fixing pin located on the upper surface of the storage pot and configured to fix a semiconductor carrier to the plate body.

13. The carrier transfer system of claim 9, wherein the plurality of carrier plates includes between 2 to 4 carrier plates.

14. The carrier transfer system of claim 9, wherein the overhead hoist transport comprises:

a transport body;

a transfer wheel disposed on the travel rail, the transfer wheel being configured to move the transport body along the travel rail;

a coupling member coupled to the travel rail;

a horizontal slider extendable from the transport body in the second direction; and a gripper connected to the horizontal slider and being movable in the first direction.

15. A semiconductor manufacturing method comprising:

moving an overhead hoist transport to a rotational interface comprising a first carrier plate and a second carrier plate spaced apart in a first direction, wherein the first carrier plate extends longitudinally in a second direction intersecting the first direction, the second carrier plate extends longitudinally in the second direction or in a third intersecting the first direction, and wherein each of the first carrier plate and the second carrier plate includes: a plate body extending longitudinally and coupled to a base column and a plurality of storage pots disposed on the plate body;

rotating the second carrier plate to be unaligned with the first carrier plate in the first direction; and loading, by the overhead hoist transport, a semiconductor carrier onto one of plurality of storage pots of the first carrier plate.

16. The semiconductor manufacturing method of claim 15, further comprising:

detecting, by a detection sensor, that the second carrier plate is an interfering carrier plate disposed above the first carrier plate in the first direction, wherein the rotating of the second carrier plate comprises rotating the second carrier plate around a base column by a rotary unit disposed in the base column.

17. The semiconductor manufacturing method of claim 15, further comprising rotating the second carrier plate to a position aligned with the first carrier plate after the loading of the semiconductor carrier onto the one of plurality of storage pots of the first carrier plate.

18. The rotational interface of claim 1, wherein each of the plurality of carrier plates is independently rotatable by the respective rotary unit to form an angular offset around the base column between the plurality of carrier plates.

* * * * *